(12) United States Patent
Owa et al.

(10) Patent No.: US 11,119,411 B2
(45) Date of Patent: Sep. 14, 2021

(54) DRIVE METHOD FOR SPATIAL LIGHT MODULATOR, METHOD FOR GENERATING PATTERN FOR EXPOSURE, AND EXPOSURE METHOD AND APPARATUS

(71) Applicant: Nikon Corporation, Chiyoda-ku (JP)

(72) Inventors: Soichi Owa, Kumagaya (JP); Yoji Watanabe, Kumagaya (JP)

(73) Assignee: Nikon Corporation, Tokyo (JP)

( * ) Notice: Subject to any disclaimer, the term of this patent is extended or adjusted under 35 U.S.C. 154(b) by 672 days.

(21) Appl. No.: 14/331,689

(22) Filed: Jul. 15, 2014

(65) Prior Publication Data

US 2015/0077732 A1 Mar. 19, 2015

Related U.S. Application Data

(63) Continuation of application No. PCT/JP2012/083753, filed on Dec. 26, 2012.

(30) Foreign Application Priority Data

Jan. 18, 2012 (JP) .............................. JP2012-007727

(51) Int. Cl.
*G03F 7/20* (2006.01)
*G02F 1/29* (2006.01)

(52) U.S. Cl.
CPC ............ *G03F 7/70058* (2013.01); *G02F 1/29* (2013.01); *G03F 7/70283* (2013.01);
(Continued)

(58) Field of Classification Search
CPC ............ G02B 26/0833; G02B 26/0841; G02B 26/085; G02B 26/0858; G02F 1/29;
(Continued)

(56) References Cited

U.S. PATENT DOCUMENTS 5,312,513 A 5/1994 Florence et al.
6,312,134 B1 11/2001 Jain et al.
(Continued)

FOREIGN PATENT DOCUMENTS

CN 1412621 4/2003
JP 2005-513770 5/2005
(Continued)

OTHER PUBLICATIONS

Notice of Reasons for Rejection from Japanese Patent Application No. 2013-554221, dated Aug. 31, 2016, 7 pages (with English translation).
(Continued)

*Primary Examiner* — Christina A Riddle
(74) *Attorney, Agent, or Firm* — Klarquist Sparkman, LLP

(57) ABSTRACT

In a drive method for a spatial light modulator, out of a first boundary region and a second boundary region arranged adjacently in a Y-direction and extending in an X-direction, mirror elements arranged at a first pitch not resolved by a projection optical system, in the X-direction in the first boundary region are set in the phase 0, and the other mirror elements therein are set in the phase π; mirror elements arranged at a second pitch not resolved by the projection optical system, in the X-direction in the second boundary region are set in the phase π, and the other mirror elements therein are set in the phase 0.

23 Claims, 14 Drawing Sheets

(52) U.S. Cl.
CPC ...... *G03F 7/70291* (2013.01); *G03F 7/70433* (2013.01); *G03F 7/70508* (2013.01)

(58) Field of Classification Search
CPC .... G02F 1/31; G03F 7/70058; G03F 7/70283; G03F 7/70291; G03F 7/70508; G03F 7/70383; G03F 7/70391; G03F 7/2051; G03F 7/70475; G03F 7/7015; G03F 7/70433; G03F 7/70483–7055
USPC ...... 355/46, 52, 53, 55, 67–71, 77; 359/316, 359/201.2, 201.1, 850, 855; 250/492.1, 250/492.2, 492.22, 492.23, 505.1, 503.1, 250/504 R; 430/5
See application file for complete search history.

(56) References Cited

U.S. PATENT DOCUMENTS

| | | | |
|---|---|---|---|
| 6,493,867 | B1 | 12/2002 | Mei et al. |
| 6,537,738 | B1 | 3/2003 | Mei et al. |
| 6,885,493 | B2 | 4/2005 | Ljungblad et al. |
| 8,792,081 | B2 | 7/2014 | Owa |
| 2002/0092993 | A1 | 7/2002 | Kanatake et al. |
| 2002/0097495 | A1 | 7/2002 | Mei |
| 2003/0076404 | A1 | 4/2003 | Taniguchi |
| 2004/0075882 | A1 | 4/2004 | Meisburger |
| 2004/0150868 | A1 | 8/2004 | Ljungblad et al. |
| 2005/0041229 | A1 | 2/2005 | Meisburger |
| 2005/0190354 | A1* | 9/2005 | de Jager ............. G03F 7/70291 355/67 |
| 2005/0243397 | A1 | 11/2005 | Latypov |
| 2006/0087635 | A1 | 4/2006 | Kazumi et al. |
| 2007/0139633 | A1* | 6/2007 | Bleeker ............... G03F 7/70291 355/67 |
| 2007/0242247 | A1 | 10/2007 | Shiraishi |
| 2008/0073588 | A1 | 3/2008 | Kruit et al. |
| 2008/0074700 | A1 | 3/2008 | Olsson et al. |
| 2009/0086176 | A1 | 4/2009 | Meisburger |
| 2009/0086182 | A1 | 4/2009 | Meisburger |
| 2009/0086307 | A1 | 4/2009 | Meisburger |
| 2009/0117494 | A1* | 5/2009 | Owa .................. G03F 7/70116 430/322 |
| 2009/0161173 | A1* | 6/2009 | Mushano ............ G03F 7/70291 358/474 |
| 2013/0050775 | A1* | 2/2013 | Curry ..................... H04N 1/047 358/474 |
| 2013/0222781 | A1* | 8/2013 | Watanabe .............. G02B 26/06 355/71 |
| 2015/0227075 | A1* | 8/2015 | Palmer ................ G03F 7/70558 399/51 |

FOREIGN PATENT DOCUMENTS

| | | |
|---|---|---|
| KR | 10-1930562 | 12/2018 |
| WO | WO 03/052516 | 6/2003 |
| WO | WO 2009/060745 | 5/2009 |
| WO | WO 2012/043497 | 4/2012 |
| WO | WO-2012043497 A1 * | 4/2012 ............. G02B 26/06 |

OTHER PUBLICATIONS

First Office Action from Chinese Application No. 201280071531.9, dated May 12, 2016, 13 pages (with English translation).
Chen et al., "Design and Fabrication of Tilting and Piston Micromirrors for Maskless Lithography", *Emerging Lithographic Technologies IX*, vol. 5751 (2005).
International Search Report of the International Searching Authority, dated Feb. 5, 2013, for corresponding International Application No. PCT/JP2012/083753, 3 pages.
Extended European Search Report from European Application No. 12865561.0, dated Apr. 19, 2016, 12 pages.
Notification of Second Office Action from Chinese Application No. 201280071531.9, dated Mar. 15, 2017, 11 pages (with English translation).
Communication pursuant to Article 94(3) EPC from related European Application No. 12865561.0, dated Apr. 11, 2019, 5 pages.
Notification of Reason for Refusal from Korean Application No. 10-2014-7022167, dated Jul. 24, 2019, 11 pages (with English translation).
Communication pursuant to Article 94(3) EPC from European Application No. 12865561.0, dated Feb. 20, 2020, 12 pages.
First Office Action from Chinese Application No. 201811146185.1, dated Mar. 27, 2020, 24 pages (with English translation).

* cited by examiner

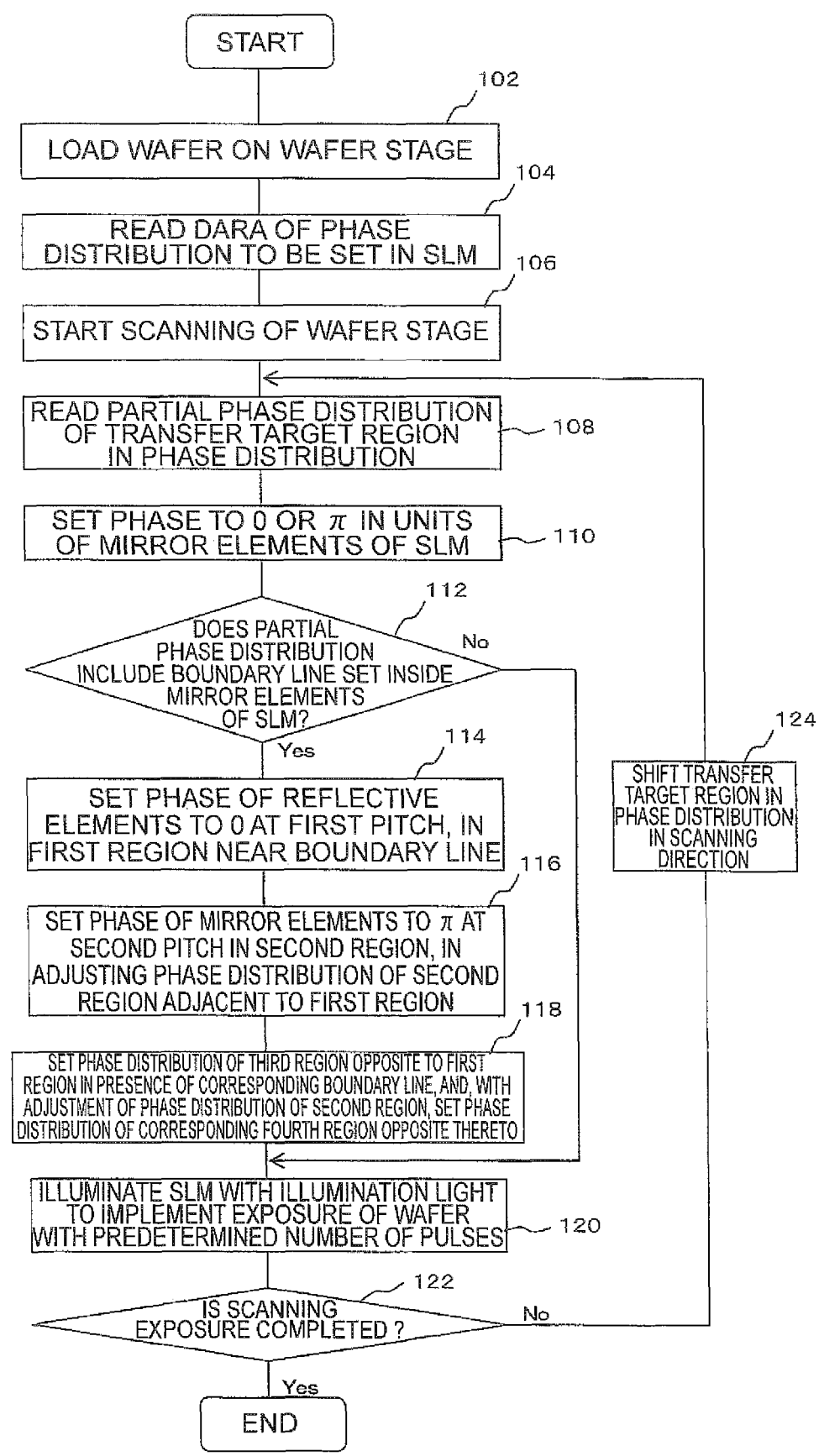

DRIVE METHOD FOR SPATIAL LIGHT MODULATOR, METHOD FOR GENERATING PATTERN FOR EXPOSURE, AND EXPOSURE METHOD AND APPARATUS

TECHNICAL FIELD

The present invention relates to a drive method for a spatial light modulator having a plurality of optical elements, a method for generating a pattern for exposure with use of a spatial light modulator, an exposure technology for exposing an object with use of a spatial light modulator, and a device manufacturing technology with use of this exposure technology.

BACKGROUND ART

Exposure apparatus of a one-shot exposure type such as steppers or exposure apparatus of a scanning exposure type such as scanning steppers are used for forming a predetermined pattern in each shot area on a substrate such as a wafer or a glass plate through a projection optical system, for example, in a lithography process for manufacturing devices (electronic devices or microdevices) such as semiconductor devices or liquid crystal display devices.

There is the recently-proposed exposure apparatus of a so-called maskless method to generate a variable pattern on the object plane of the projection optical system, using spatial light modulators (SLM) having an array of many microscopic mirrors an inclination angle of each of which is variable, instead of masks, for efficiently manufacturing each of devices, while suppressing an increase of manufacturing cost due to preparation of masks for respective types of devices and masks for respective layers on the substrate (e.g., cf. Patent Literature 1). Furthermore, there are also the proposed spatial light modulators of a type having an array of many microscopic mirrors a height of a reflective face of each of which is controllable, in order to control a phase distribution of incident light (e.g., cf. Non Patent Literature 1).

CITATION LIST

Patent Literature

Patent Literature 1: International Publication WO 2009/060745

Non Patent Literature

Non Patent Literature 1: Yijian Chen et al., "Design and fabrication of tilting and piston micromirrors for maskless lithography," Proc. of SPIE (USA) Vol. 5751, pp. 1023-1037 (2005)

SUMMARY OF INVENTION

Technical Problem

For forming a pattern on a substrate with the use of the conventional spatial light modulator, the pattern has been formed heretofore in minimum units of images of the respective micromirrors (optical elements) of the spatial light modulator. For this reason, it was difficult, for example, to set the position of the pattern with position accuracy finer than the width of the images of the micromirrors and it was also difficult to form a line-and-space pattern with a pitch equal to a non-integral multiple of the width of the images of the micromirrors.

Aspects of the present invention, in light of the above-described circumstances, have an object to, in projecting (or forming) a pattern onto an object with use of a spatial light modulator having an array of optical elements, enable the pattern to be formed with position accuracy or shape accuracy finer than the width of images of the optical elements.

Solution to Problem

A first aspect of the present invention provides a drive method for a first spatial light modulator having an array of a plurality of optical elements each of which can guide light to a projection optical system. This drive method comprises: out of a first region and a second region arranged adjacently in a first direction and each extending in a second direction intersecting with the first direction, setting a plurality of aforementioned optical elements arranged at a first pitch not resolved by the projection optical system, in the second direction in the first region, in a first state, and setting the other optical elements in the first region in a second state different from the first state; and setting a plurality of aforementioned optical elements arranged at a second pitch not resolved by the projection optical system, in the second direction in the second region, in the second state, and setting the other optical elements in the second region in the first state.

Furthermore, a second aspect provides a drive method for a second spatial light modulator having an array of a plurality of optical elements each of which can guide light to a projection optical system. This drive method comprises: out of a first region and a second region arranged adjacently or separately in a first direction and each extending in a second direction intersecting with the first direction, setting a plurality of aforementioned optical elements arranged at a first pitch not resolved by the projection optical system, in the second direction in the first region, in a first state, and setting the other optical elements in the first region in a second state different from the first state; and setting at least a partial set of the optical elements in the second region in the first state.

Furthermore, a third aspect provides an exposure method for exposing a substrate with exposure light via a spatial light modulator having an array of a plurality of optical elements and via a projection optical system. This exposure method comprises: setting at least a partial set of the plurality of optical elements in the first state or in the second state by the drive method for the spatial light modulator of the first aspect or the second aspect; and exposing the substrate with a spatial image formed with the exposure light via the plurality of optical elements set in the first state or in the second state and via the projection optical system.

Furthermore, a fourth aspect provides an exposure apparatus for exposing a substrate with exposure light from an illumination optical system via a projection optical system. This exposure apparatus comprises: a spatial light modulator arranged on the object plane side of the projection optical system and having an array of a plurality of optical elements each of which can be controlled so as to guide the exposure light to the projection optical system; and a control device for driving the plurality of optical elements of the spatial light modulator, wherein the control device performs the following control in accordance with a spatial image formed on the substrate via the projection optical system: out of a first region and a second region arranged adjacently or separately in a first direction and each extending in a second direction intersecting with the first direction, the control device sets a plurality of aforementioned optical elements arranged at a first pitch not resolved by the projection optical system, in the second direction in the first region, in a first state and sets the other optical elements in the first region in a second state different from the first state; and the control device sets at least a partial set of the optical elements in the second region in the first state.

Furthermore, a fifth aspect provides a method for generating a pattern for exposure with a plurality of sections arranged in a grid pattern, which is used in exposure of a substrate with use of a projection optical system. This method for generating the pattern for exposure comprises: out of the plurality of sections arranged in a first region and a second region arranged adjacently or separately in a first direction and each extending in a second direction intersecting with the first direction, setting a plurality of aforementioned sections arranged at a first pitch not resolved by the projection optical system, in the second direction in the first region, in a first state, and sets the other sections in the first region in a second state different from the first state; and setting at least a partial set of the sections in the second region in the first state.

Furthermore, a sixth aspect provides a device manufacturing method comprising: forming a pattern of a photosensitive layer on the substrate, using the exposure method of the third aspect or the exposure apparatus of the fourth aspect; and processing the substrate on which the pattern has been formed.

Advantageous Effects of Invention

According to the aspects of the present invention, the spatial light modulator is controlled so that a plurality of optical elements arranged at the first pitch not resolved by the projection optical system, in the second direction in the first region are set in the first state and so that the other optical elements in the first region are set in the second state different from the first state, whereby it becomes feasible to shift an image of a boundary line of the first region (an end portion of the optical elements) with position accuracy finer than the width of images of the optical elements in the first direction intersecting with the second direction. Therefore, when a pattern is projected onto (or formed on) an object with the use of the spatial light modulator having the array of the plurality of optical elements, the pattern can be formed with position accuracy or shape accuracy finer than the width of the images of the optical elements.

BRIEF DESCRIPTION OF DRAWINGS

FIG. 8 is a flowchart showing an example of exposure operation with the use of the spatial light modulator.

DESCRIPTION OF EMBODIMENTS

An example of the embodiment of the present invention will be described with reference to FIGS. 1 to 8.

Figure 1:
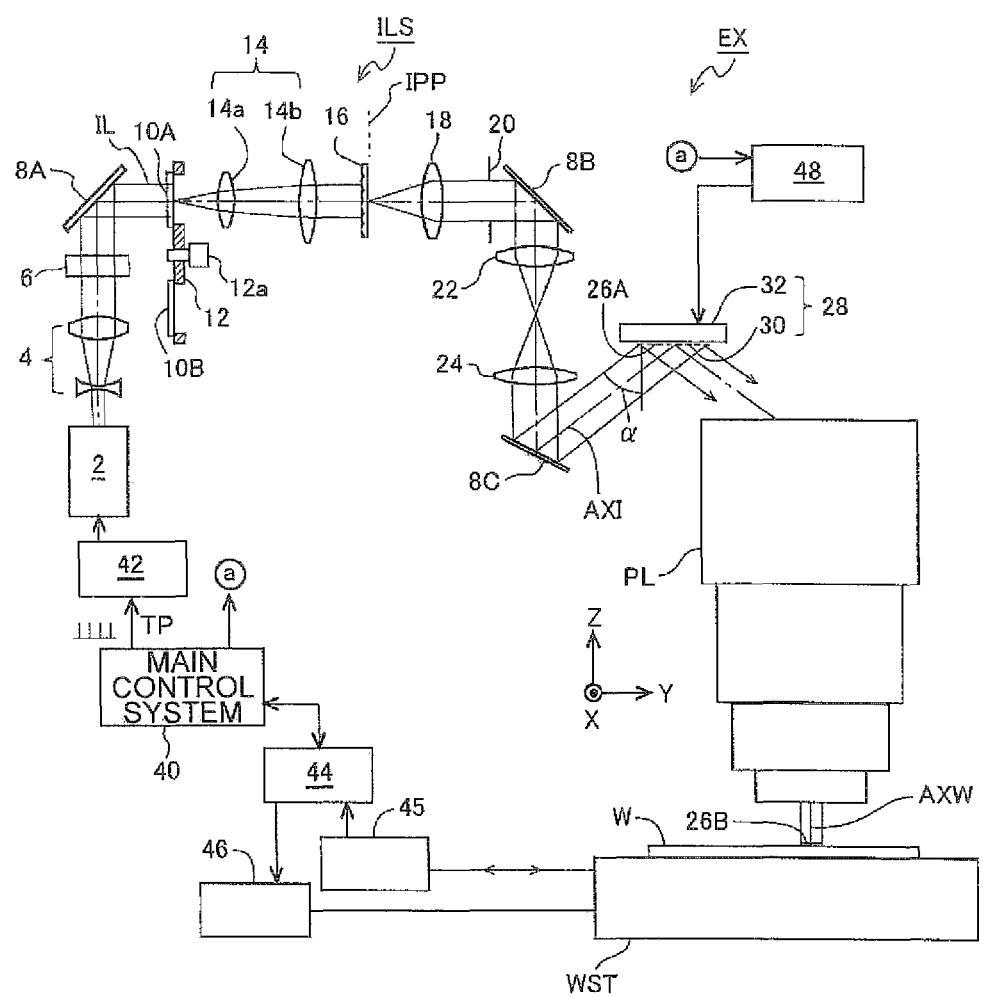
FIG. 1 is a drawing showing a schematic configuration of an exposure apparatus according to an example of embodiment.

FIG. 1 shows a schematic configuration of an exposure apparatus EX of the maskless method according to the present embodiment. In FIG. 1, the exposure apparatus EX has a light source 2 for exposure which emits pulses of light, an illumination optical system ILS which illuminates an illumination target surface with illumination light (exposure light) IL for exposure from the light source 2, a spatial light modulator 28 with a large number of mirror elements 30 which are respective height-variable microscopic mirrors arranged in a two-dimensional array pattern approximately on the illumination target surface or on a surface near it, and a modulation control unit 48 which drives the spatial light modulator 28. Furthermore, the exposure apparatus EX has a projection optical system PL which receives the illumination light IL reflected by a reflective, variable, uneven pattern (mask pattern with a variable phase distribution) generated by the large number of mirror elements 30 and which projects a spatial image (device pattern) formed corresponding to the uneven pattern (phase distribution), onto a surface of a wafer W (substrate), a wafer stage WST which performs positioning and movement of the wafer W, a main control system 40 consisting of a computer which generally controls the operation of the overall device, various control systems, and so on.

The description hereinafter will be based on such a coordinate system that in FIG. 1, the Z-axis is set along a direction perpendicular to a bottom surface of the wafer stage WST (a plane parallel to an unrepresented guide surface), the Y-axis is set along a direction parallel to the plane of FIG. 1 in a plane normal to the Z-axis, and the X-axis is set along a direction normal to the plane of FIG. 1. Furthermore, angles around the X-axis, Y-axis, and Z-axis will also be called angles in θx direction, θy direction, and θz direction, respectively. In the present embodiment, the wafer W is scanned in the Y-direction (scanning direction) during exposure.

The light source 2 used herein is an ArF excimer laser light source which emits pulses of substantially linearly polarized laser light with the wavelength of 193 nm and the pulse width of about 50 ns, at the frequency of approximately 4-6 kHz. The light source 2 also applicable herein can be, for example, a KrF excimer laser light source with the wavelength of 248 nm, a light emitting diode which emits pulsed light, or a solid-state pulsed laser light source which generates a harmonic of laser light output from a YAG laser or a solid-state laser (semiconductor laser or the like). The solid-state pulsed laser light source can emit pulses of laser light, e.g., with the wavelength of 193 nm (or any one of various wavelengths except for it) and with the pulse width of about 1 ns, at the frequency of approximately 1-2 MHz.

In the present embodiment, a power supply 42 is connected to the light source 2. The main control system 40 supplies to the power supply 42, emission trigger pulses TP indicative of timing and light quantity (pulse energy) of pulsed emission. In synchronism with the emission trigger pulses TP, the power supply 42 makes the light source 2 emit pulses at the indicated timing and light quantity.

The illumination light IL consisting of a substantially parallel beam of pulsed laser light with a rectangular sectional shape emitted from the light source 2 travels via a beam expander 4 consisting of a pair of lenses, via a polarization control optical system 6 to control a state of polarization of the illumination light IL, and via a mirror 8A, to enter a diffractive optical element (diffractive optical element 10A in FIG. 1) selected from a plurality of diffractive optical elements 10A, 10B, and so on, in parallel with the Y-axis. The polarization control optical system 6 is, for example, an optical system that can set one of a half wave plate to rotate the direction of polarization of the illumination light IL, a quarter wave plate to convert the illumination light IL into circularly polarized light, and a birefringent prism of a wedge shape to convert the illumination light IL into randomly polarized light (unpolarized light), in a replaceable manner on the optical path of the illumination light IL.

The diffractive optical elements 10A, 10B, etc. are fixed at approximately equal angle intervals to a peripheral part of a rotary plate 12. The main control system 40 controls the angle of the rotary plate 12 through a drive unit 12a, to set a diffractive optical element selected according to an illumination condition, on the optical path of the illumination light IL. The illumination light IL diffracted by the selected diffractive optical element is guided to an entrance plane of a microlens array 16 by a relay optical system 14 consisting of lenses 14a, 14b. The illumination light IL incident into the microlens array 16 is two-dimensionally divided by a large number of microscopic lens elements forming the microlens array 16, to form a secondary light source (surface light source) on a pupil plane (illumination pupil plane IPP) of the illumination optical system ILS which is a rear focal plane of each lens element.

As an example, the diffractive optical element 10A is provided for normal illumination, the diffractive optical element 10B is for small σ illumination to generate illumination light with a small coherence factor (σ value), and other diffractive optical elements (not shown) are also provided for dipolar illumination, for quadrupolar illumination, for annular illumination, and so on. A spatial light modulator having an array of a large number of microscopic mirrors an inclination angle of each of which is variable, may be used instead of the plurality of diffractive optical elements 10A, 10B, etc., and a fly's eye lens or the like can also be used instead of the microlens array 16.

The illumination light IL from the secondary light source formed on the illumination pupil plane IPP travels via a first relay lens 18, a field stop 20, a mirror 8B to bend the optical path into the −Z-direction, a second relay lens 22, a condenser optical system 24, and a mirror 8C, to be incident at an average incidence angle α in the θx direction onto the illumination target surface (a surface where a designed transfer pattern is arranged) parallel to the XY plane. In other words, the optical axis AXI of the illumination optical system ILS intersects at the incidence angle α in the θx direction with the illumination target surface. The incidence angle α is, for example, from several deg (°) to several ten deg. In a power-off condition, reflective faces of the large number of mirror elements 30 arranged in the two-dimensional array pattern in the spatial light modulator 28 are arranged on or near the illumination target surface. The illumination optical system ILS is constructed including the optical members from the beam expander 4 to the condenser optical system 24 and the mirror 8C. The illumination light IL from the illumination optical system ILS illuminates a rectangular illumination region 26A elongated in the X-direction on the array of the large number of mirror elements 30 in the spatial light modulator 28, with a substantially uniform illuminance distribution. The large number of mirror elements 30 are arranged at predetermined pitches in the X-direction and in the Y-direction in a rectangular region including the illumination region 26A. The illumination optical system ILS and the spatial light modulator 28 are supported on a frame not shown.

Figure 2A:
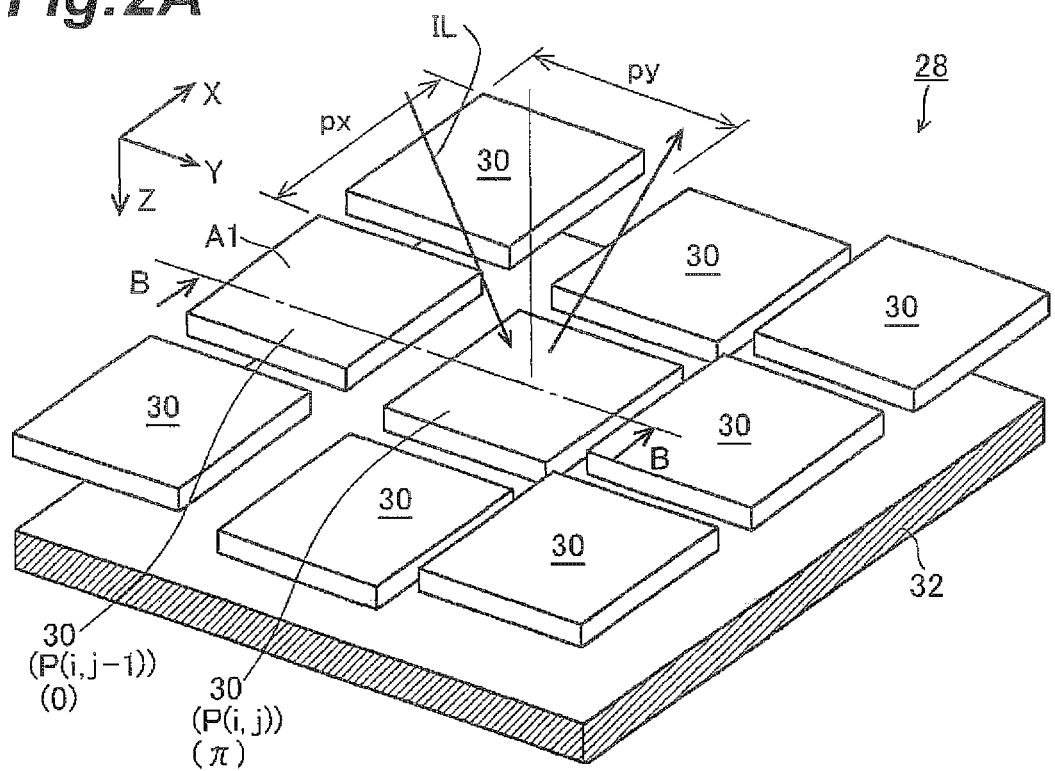
FIG. 2A is an enlarged perspective view showing a part of a spatial light modulator 28 in FIG. 1.
Figure 2B:
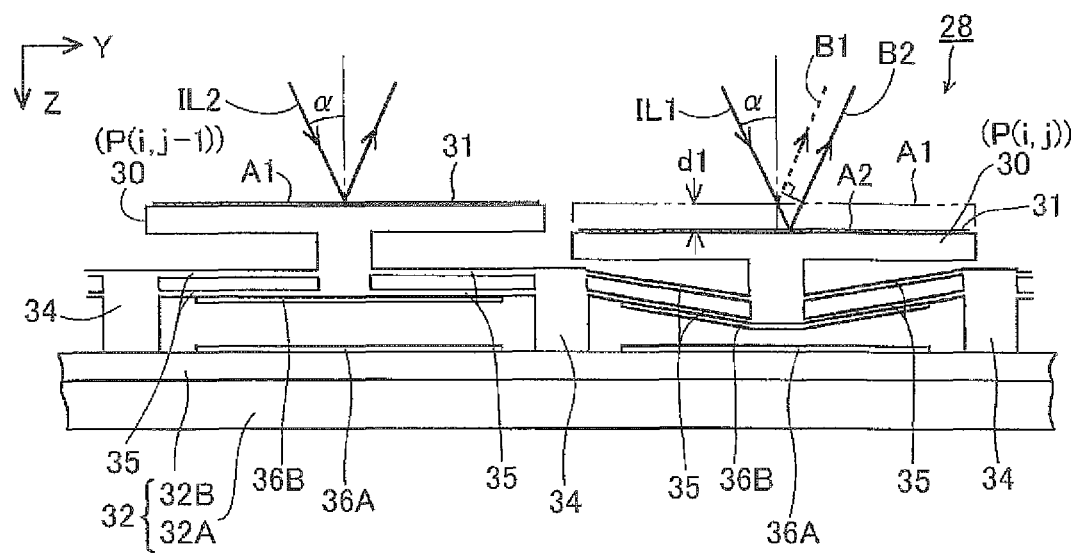
FIG. 2B is a cross-sectional view along the line BB in FIG. 2A.

FIG. 2A is an enlarged perspective view showing a part of a reflective surface of the spatial light modulator 28 in FIG. 1, and FIG. 2B a cross-sectional view along the line BB in FIG. 2A. In FIG. 2A, the large number of mirror elements 30 are arranged at the pitches (periods) px and py in the X-direction and in the Y-direction, respectively, in the reflective surface of the spatial light modulator 28. The X-directional and Y-directional widths of the mirror elements 30 can be assumed to be nearly equal to the pitches px and py, respectively. As an example, the mirror elements 30 are square and the pitches px, py are equal to each other. It is noted herein that the mirror elements 30 may have a rectangular shape or other shape and the pitches px, py may be different from each other.

In the reflective surface, each of the mirror elements 30 is located at a position P(i, j) which is the ith position (i=1, 2, . . . , I) in the X-direction and the jth position (j=1, 2, . . . , J) in the Y-direction. As an example, the number J of mirror elements 30 arranged in the Y-direction (direction corresponding to the scanning direction of the wafer W) is from several hundred to several thousand, and the number I of mirror elements 30 arranged in the X-direction is from several to several ten times the number J. Furthermore, the pitch (or width) px (=py) of arrangement of the mirror elements 30 is, for example, approximately from 10 µm to 1 µm.

The spatial light modulator 28 has the large number of mirror elements 30, and a base member 32 which supports each of the mirror elements 30 through hinge portions 35 (cf. FIG. 2B) each with flexibility (elasticity).

In FIG. 2B, the base member 32 is composed of a substrate 32A of a flat plate shape which is, for example, comprised of silicon, and an insulating layer 32B of silicon nitride (e.g., $Si_3N_4$) or the like formed on a surface of the substrate 32A. Support portions 34 are formed at predetermined pitches in the X-direction and in the Y-direction on the surface of the base member 32 and a back-side projection of each mirror element 30 is supported through a pair of two-stage hinge portions 35 with flexibility in the Z-direction by elastic deformation, between adjacent Y-directional support portions 34. The support portions 34, hinge portions 35, and mirror elements 30 are integrally formed, for example, of polysilicon. A reflective film 31 comprised of a thin film of metal (e.g., aluminum or the like) to enhance reflectivity is formed on the reflective surface (front surface) of each mirror element 30.

Furthermore, electrodes 36A are formed on the surface of the base member 32 on the bottom side of mirror elements 30 and electrodes 36B are formed on the respective bottom faces of the hinge portions 35 so as to be opposed to the electrodes 36A. Signal lines (not shown) for applying a predetermined voltage between corresponding electrodes 36A, 36B for each mirror element 30 are provided in a matrix on the surface of the base member 32 and on the side faces of the support portions 34. In this case, in a power-off condition or in a power-on condition without application of the voltage between the electrodes 36A, 36B (first state), the reflective surface of the mirror element 30 agrees with a reference plane A1 which is a plane parallel to the XY plane, as indicated by the mirror element 30 at the position P(i, j−1) where the illumination light IL2 is incident. On the other hand, in the power-on condition with application of the predetermined voltage between the electrodes 36A, 36B (second state), the reflective surface of the mirror element 30 agrees with a plane A2 displaced by a distance d1 in the Z-direction from the reference plane A1 in parallel with the XY plane, as indicated by the mirror element 30 at the position P(i, j) where the illumination light IL1 is incident. The modulation control unit 48 in FIG. 1 controls the voltage between the electrodes 36A, 36B for each mirror element 30 at the position P(i, j), in accordance with information of the phase distribution (uneven pattern) of the illumination light IL set from the main control system 40. Each mirror element 30 is set either in the first state or in the second state.

The spatial light modulator 28 of this microscopic three-dimensional structure can be manufactured by use of the MEMS (Microelectromechanical Systems) technology, for example, as described in Non Patent Literature 1 cited in the Background Art. Since each mirror element 30 of the spatial light modulator 28 needs only to be set in the first state or in the second state by parallel displacement, it is easy to achieve downsizing of the mirror elements 30 and increase in the number of arrangement of mirror elements 30.

In the state in which the reflective surface of each mirror element 30 agrees with the reference plane A1 (the first state), let us define a change amount of the phase of the illumination light IL reflected by the mirror element 30, as a first phase δ1; in the present embodiment the phase δ1 is 0°. In the state in which the reflective surface of each mirror element 30 agrees with the plane A2 displaced by the distance d1 from the reference plane A1 (the second state), let us define a change amount of the phase of the illumination light IL reflected by the mirror element 30, as a second phase δ2; the phase δ2 is different by 180° (π (rad)) from the phase δ1. Namely, the relations below hold. It is, however, noted that an error of several deg (°) or so from the below formula is permitted for the phase δ2, with consideration to manufacturing error of the spatial light modulator 28, driving error by the modulation control unit 48, and so on.

$$δ1=0°  \quad (1A),$$

$$δ2=180°=π(rad) \quad (1B)$$

In the description hereinafter the phases without unit will refer to phases in rad. The second phase δ2 is a difference between the change amount of the phase of the wavefront of reflected light B1 indicated by a dotted line in the state in which the reflective face of the mirror element 30 at the position P(i, j) agrees with the reference plane A1 and the change amount of the phase of the wavefront of reflected light B2 in the state in which the reflective face agrees with the plane A2 at the distance d1. As an example, when the incidence angle α is assumed to be approximately 0° and the wavelength of the illumination light IL1 entering the reflective face of the mirror element 30 is represented by λ (λ=193 nm herein), the distance d1 is given as follows.

$$d1=λ/4 \quad (2)$$

In FIG. 2A, each of the mirror elements 30 of the spatial light modulator 28 is controlled into the first state in which the mirror element 30 reflects the illumination light IL incident thereto with the phase change of 0° or into the second state in which the mirror element 30 reflects the illumination light IL incident thereto with the phase change of 180°. In the description hereinafter, the mirror element 30 set in the first state will also be referred to as a mirror element of phase 0 and the mirror element 30 set in the second state as a mirror element of phase π.

As an example, at every emission of a predetermined number of pulses of the illumination light IL, the main control system 40 supplies information of a phase distribution (uneven pattern) of the illumination light IL to be set by the spatial light modulator 28, to the modulation control unit 48. In accordance therewith, the modulation control unit 48 controls each of the mirror elements 30 of the spatial light modulator 28 into the phase 0 or into the phase π. A spatial image according to the phase distribution is formed on the surface of the wafer W.

In FIG. 1, the illumination light IL, after reflected by the array of many mirror elements 30 in the illumination region 26A of the spatial light modulator 28, is incident at the average incidence angle α into the projection optical system PL. The projection optical system PL with the optical axis AXW supported by an unrepresented column is a reduction projection optical system which is non-telecentric on the spatial light modulator 28 (object plane) side and telecentric on the wafer W (image plane) side. The projection optical system PL forms a demagnified image of the spatial image according to the phase distribution of the illumination light IL set by the spatial light modulator 28, on an exposure region 26B (which is a region optically conjugate with the illumination region 26A) in one shot area on the wafer W. A projection magnification β of the projection optical system PL is, for example, approximately from 1/10 to 1/100. When it is assumed that the numerical aperture on the image plane side of the projection optical system PL is NA, the wavelength of the illumination light IL is λ, and the illumination condition is normal illumination, the resolution Re of the projection optical system PL (the resolution limit expressed by twice the pitch or line width of a periodic pattern) is given as follows.

$$Re=\lambda/(NA) \tag{3}$$

As an example, the resolution Re is set so as to be equal to or several times larger than the width (β·py) of the image of the mirror element 30 of the spatial light modulator 28. For example, when the size of the mirror element 30 (pitch of arrangement) is approximately several μm and the projection magnification β of the projection optical system PL is about 1/100, the resolution Re is approximately from several ten nm to several times thereof. The wafer W (substrate) includes, for example, one obtained by coating a surface of a base material of a circular flat plate shape of silicon or SOI (silicon on insulator), with a photoresist (photosensitive material) in the thickness of about several ten nm to 200 nm.

With the use of the projection optical system PL non-telecentric on the object side as in the present embodiment, the reflective faces of the large number of mirror elements 30 in the spatial light modulator 28 and the exposure surface of the wafer W (the surface of the photoresist) can be arranged approximately in parallel to each other. Therefore, it is easy to design and manufacture the exposure apparatus. Furthermore, the polarization state of the illumination light IL can be set to an arbitrary state.

When the exposure apparatus EX is of a liquid immersion type, it is provided with a local liquid immersion device to supply and collect a liquid (e.g., pure water) which transmits the illumination light IL, between an optical member at the tip of the projection optical system PL and the wafer W, for example, as disclosed in U.S. Pat. Published Application No. 2007/242247. The resolution can be further enhanced in the case of the liquid immersion type because the numerical aperture NA can be set larger than 1.

In FIG. 1, the wafer W is sucked and held on the top surface of the wafer stage WST through a wafer holder (not shown) and the wafer stage WST is configured to implement step movement in the X-direction and Y-direction on an unillustrated guide surface and movement at a constant speed in the Y-direction. X-directional and Y-directional positions, an angle of rotation in the θz direction, etc. of the wafer stage WST are measured with a laser interferometer 45 and this measurement information is supplied to a stage control system 44. The stage control system 44 controls the position and speed of the wafer stage WST through a driving system 46 such as a linear motor, based on the control information from the main control system 40 and the measurement information from the laser interferometer 45. The device is also provided with an alignment system (not shown) to detect positions of alignment marks on the wafer W, for carrying out alignment of the wafer W.

In exposure of the wafer W, the alignment of the wafer W is first carried out and thereafter the illumination condition of the illumination optical system ILS is set, as basic operation. Furthermore, the main control system 40 supplies to the modulation control unit 48, information of a phase distribution corresponding to a pattern to be exposed in each shot area on the wafer W. Then the wafer W is positioned at a scan start position, for example, for carrying out exposure in shot areas SA21, SA22, . . . aligned on a line in the Y-direction on the surface of the wafer W shown in FIG. 3A. Thereafter, scan is started at a constant speed in the +Y-direction on the wafer W. Arrows in the shot area SA21 and other areas in FIG. 3A indicate directions of movement of the exposure region 26B relative to the wafer W.

Next, the main control system 40 supplies to the modulation control unit 48, the information of the relative position of the shot area SA21 on the wafer W to the exposure region 26B and the modulation control unit 48 reads out a partial phase distribution as a transfer target in accordance with the relative position and sets the read partial phase distribution in the spatial light modulator 28. Then the main control system 40 supplies the emission trigger pulses TP to the power supply 42, whereby the exposure region 26B on the wafer W is exposed with the target spatial image according to the position in the Y-direction. This operation is repeatedly carried out every time the wafer W has moved by a predetermined amount and before the shot area SA21 has crossed the exposure region 26B.

Thereafter, for exposure of the shot area SA22 adjacent to the shot area SA21 on the wafer W, while the wafer W is kept scanned in the same direction, the main control system 40 supplies the information of the relative position of the shot area SA22 to the exposure region 26B to the modulation control unit 48 and supplies the emission trigger pulses TP to the power supply 42. In this manner, the exposure can be continuously carried out from the shot area SA21 to SA22 in the maskless method. Then, supposing the exposure is shifted to a line including the adjacent shot areas SA31, SA32 in the X-direction on the wafer W in FIG. 3A, the wafer stage WST is actuated to implement step movement of the wafer W in the X-direction (non-scanning direction perpendicular to the scanning direction). Then, the scanning direction of the wafer W relative to the exposure region 26B indicated by a dotted line is set to the opposite −Y-direction, and the main control system 40 supplies the information of the relative position of the shot area SA31 or the like to the exposure region 26B to the modulation control unit 48 and supplies the emission trigger pulses TP to the power supply 42. By this, the exposure can be continuously carried out from the shot area SA32 to SA31. In this exposure, it is also possible to implement exposure of mutually different spatial images in the shot areas SA21, SA22, and so on. Thereafter, the photoresist of the wafer W is developed to form a resist pattern corresponding to a circuit pattern in each shot area on the wafer W.

Next, the below will explain an operation to form a pattern with position accuracy and/or shape accuracy finer than the width of images of the mirror elements 30 of the spatial light modulator 28, in the exposure apparatus EX of the present embodiment. First, let us assume that exposure is conducted on the surface of the wafer W while gradually shifting one or more line patterns extending in the X-direction, by a finer shift amount than the width of the images of the mirror elements 30. The illumination condition of the illumination optical system ILS in this case is set, for example, as follows: illumination is small σ illumination with the σ value of about 0.14 and the polarization direction of the illumination light IL is the X-direction (the longitudinal direction of line pattern) on the wafer W.

Figure 4A:
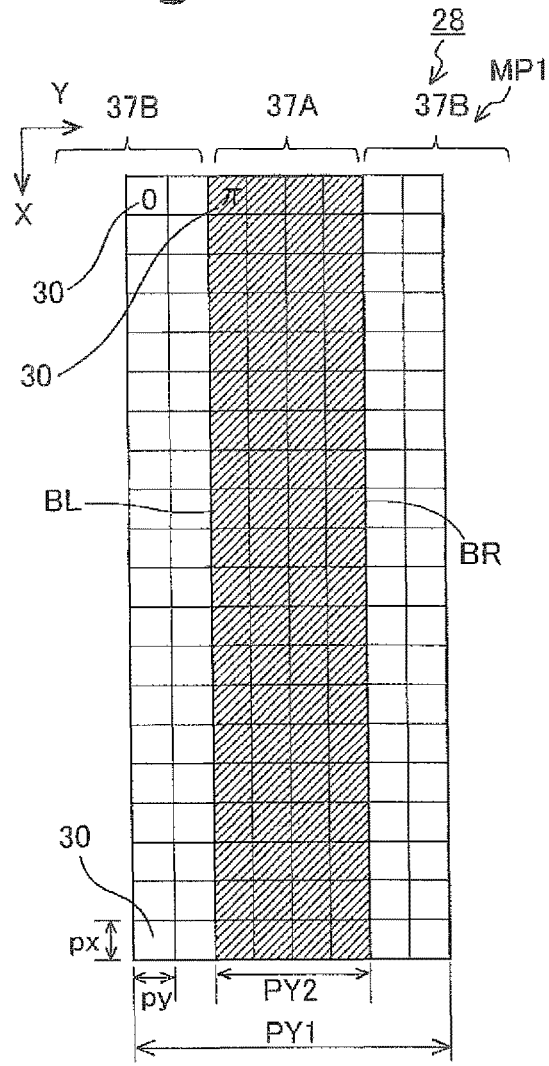
FIG. 4A and FIG. 4B are partially enlarged plan views respectively showing examples of phase distributions of reflected light set by the spatial light modulator, and FIG. 4C and FIG. 4D drawings showing intensity profiles of spatial images corresponding to the phase distributions of FIG. 4A and FIG. 4B, respectively.

First, let us assume a situation where a center of each line pattern to be formed on the surface of the wafer W is located at a boundary portion of images of a plurality of mirror elements 30. In this case, the phase distribution of the array of mirror elements 30 of the spatial light modulator 28 is set to a distribution, as shown in the partially enlarged plan view of FIG. 4A (which is an arrangement viewed from the base member 32 side; the same also applies to the description hereinafter), wherein each of the mirror elements 30 is set in the second state (phase π) in a rectangular first pattern region 37A including the mirror elements 30 in a plurality of columns in the Y-direction (e.g., four columns or more) and a plurality of rows in the X-direction (e.g., fifteen rows or more) and wherein each of the mirror elements 30 is set in the first state (phase 0) in a rectangular second pattern region 37B adjacent in the −Y-direction to the first pattern region 37A and having much the same size as the first pattern region 37A (two columns in the +Y-direction of which are shown in FIG. 4A). For convenience of description, the mirror elements 30 in the second state (phase π) are hatched in FIG. 4A and below-described FIG. 4B, FIGS. 5A to 5C, and so on. The pitches of the arrangement in the X-direction and the Y-direction of the mirror elements 30 (the widths of the mirror elements 30) are px and py (px=py herein).

As an example, the pattern regions 37A, 37B with the Y-directional width PY2 (PY2=4py in FIG. 4A) are alternately and repetitively arranged in the Y-direction to form a periodical phase distribution and FIG. 4A shows a phase pattern MP1 of one pitch PY1 (PY1=2PY2) in the Y-direction out of the periodical phase distribution. In FIG. 4A, an array of mirror elements 30 of phase 0 in two columns arranged adjacent in the +Y-direction to the first pattern region 37A is a part of the second pattern region 37B in the next cycle. Similarly, below-described FIG. 4B, FIGS. 5A to 5C, etc. also show phase patterns MP1A, MP1B-MP1D, and so on of one pitch (one cycle) in the Y-direction out of respective phase distributions.

Figure 4B:
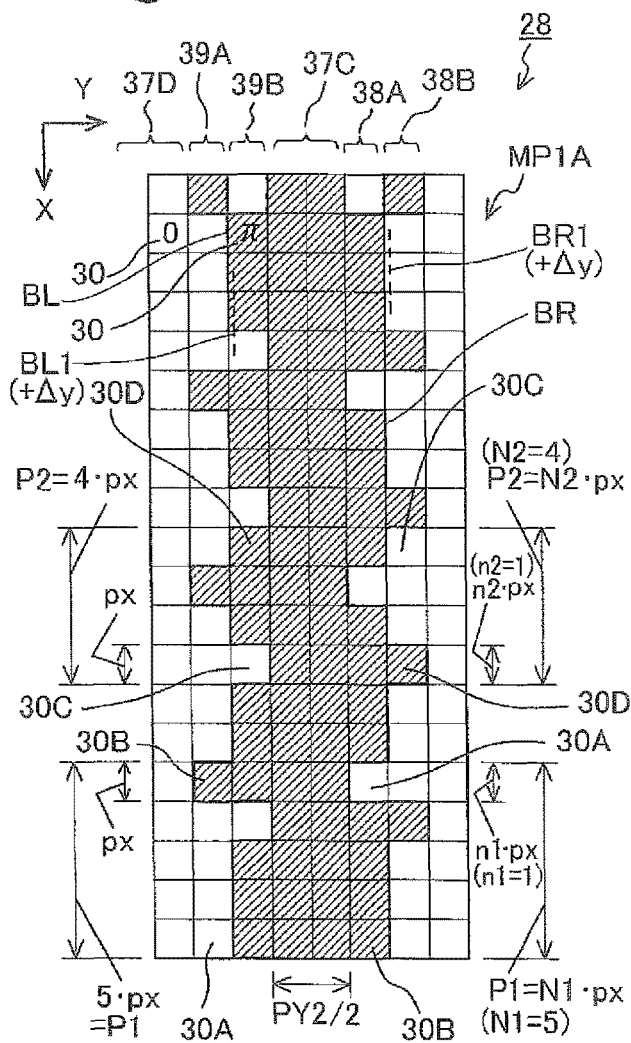
Figure 4C:
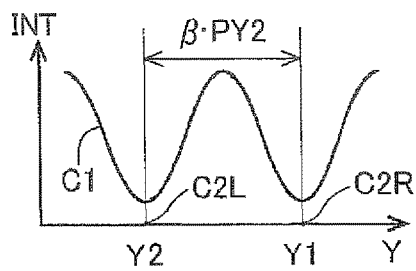
Figure 6A:
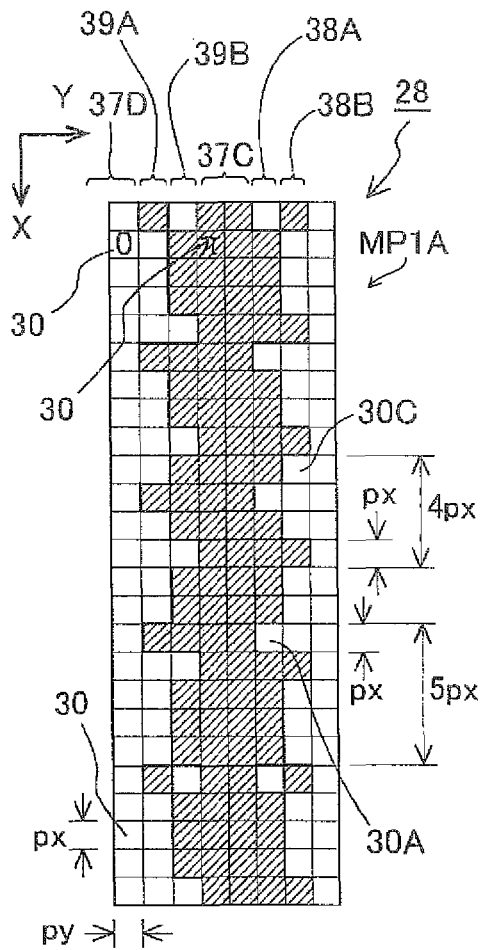
FIG. 6A is a partially enlarged plan view showing an example of a phase distribution of reflected light set in an embodiment, FIG. 6B a partially enlarged plan view showing a phase distribution of reflected light in a comparative example, FIG. 6C an enlarged view showing a resist pattern corresponding to a spatial image of the phase distribution in the embodiment, and FIG. 6D an enlarged view showing a resist pattern in the comparative example.

A Y-directional distribution of intensity INT of a spatial image projected, for example, onto a positive photoresist layer on the surface of the wafer W by the illumination light IL from the phase pattern MP1 of FIG. 4A becomes minimum at Y-directional positions Y1, Y2, as shown by the intensity profile C1 of FIG. 4C, and a distance between the positions Y1, Y2 is β·PY2 (β is the projection magnification). In other words, the intensity profile C1 is at low levels (levels lower than a photosensitive level) in portions centered on center lines C2R and C2L (at the positions Y1 and Y2) parallel to the X-direction, which are conjugate with boundary lines BR and BL between the pattern region 37A and the ±Y-directional pattern regions 37B in FIG. 4A, and is at high levels (levels over the photosensitive level) on both sides thereof. When the photoresist layer is developed, we obtain, as shown in FIG. 6A, two line patterns C1P indicated by dotted lines, which consist of resist patterns elongated in the X-direction with the Y-directional width β·PY2/2 (PY2=4py herein) and the Y-directional space β·PY2/2. The Y-directional positions of the center lines C2R, C2L of the two line patterns C1P are Y2 and Y1 in FIG. 4C. In fact, a large number of line patterns C1P are periodically formed in the Y-direction.

Next, let us assume that the centers of the line patterns formed on the surface of the wafer W are shifted in the Y-direction by a distance δ1 smaller than the width of the images of the mirror elements 30 (or by a distance obtained by adding to an integral multiple of the width of the images, a fraction smaller than the width). A distribution of intensity INT of a spatial image for forming the line patterns after the shift is moved, as shown by a solid-line intensity profile 60A of FIG. 4D, by δ1 in the Y-direction with respect to the dotted-line intensity profile C1 before the shift. This becomes necessary in a case where, for example, at a position away in the X-direction from the resist pattern corresponding to the phase pattern MP1 of FIG. 4A, a resist pattern is formed in a shape achieved by shifting the aforementioned resist pattern by the distance δ1 in the Y-direction, or in a case where the phase pattern MP1 generated by the spatial light modulator 28 is gradually shifted in the Y-direction while following Y-directional movement of the wafer W during scanning exposure of the wafer W.

In these cases, the phase pattern MP1A of the array of mirror elements 30 of the spatial light modulator 28 can be one substantially equivalent to a phase distribution (target phase distribution) in which the phase is π inside boundary lines BR1 and BL1 resulting from a Y-directional shift of the boundary lines BR and BL of the phase pattern MP1 of FIG. 4A by Δy (=δ1/β) corresponding to δ1 and the phase is 0 outside of those boundary lines, as shown in FIG. 4B. In the phase pattern MP1A of FIG. 4B, all the mirror elements 30 in a first pattern region 37C corresponding to a portion excluding the mirror elements 30 in each one of the columns at the two Y-directional ends in the first pattern region 37A in FIG. 4A are in the phase π (the second state). Furthermore, the mirror elements 30 in a second pattern region 37D consisting of an array of mirror elements 30 in a plurality of columns (two columns herein) corresponding to a portion excluding each one of the columns at the two Y-directional ends in the second pattern region 37B in FIG. 4A are in the phase 0 (the first state). In a first boundary region 38A consisting of the mirror elements 30 in one column arranged adjacent in the +Y-direction to the first pattern region 37C, a plurality of mirror elements 30A arranged at a first pitch P1 which is not resolved by the projection optical system PL, in the X-direction are set in the phase 0 and the other mirror elements 30B in the first boundary region 38A are set in the phase π. Furthermore, in a second boundary region 38B consisting of the mirror elements 30 in one column arranged adjacent in the +Y-direction to the first boundary region 38A, a plurality of mirror elements 30D arranged at a second pitch P2 which is not resolved by the projection optical system PL, in the X-direction are set in the phase π and the other mirror elements 30C in the second boundary region 38B are set in the phase 0. A boundary between the boundary regions 38A, 38B is the boundary line BR before the shift of the phase pattern.

Now, supposing the mirror elements 30 as many as N1 and N2 (each of N1 and N2 is an integer of not less than 2) are included within the pitches P1 and P2, respectively, the following relations hold.

$$P1 = N1 \cdot px \quad (4A),$$

$$P2 = N2 \cdot px \quad (4B)$$

Here, using the projection magnification β of the projection optical system PL, a pitch of an image of the phase pattern of the pitch P1 is β·P1. Since the pitches P1, P2 are set so as not to be resolved by the projection optical system PL, we can determine them by finding conditions that ±first-order diffracted light from the phase patterns does not pass through the projection optical system PL. By using the resolution Re of the projection optical system PL of Expression (3) and Expressions (4A), (4B), the conditions that the phase patterns of the pitches P1, P2 are not resolved by the projection optical system PL, i.e., the conditions that the phase patterns of the pitches P1, P2 exceed the resolution limit of the projection optical system PL are given as follows.

$$\beta \cdot P1 = \beta \cdot N1 \cdot px < \lambda/NA \quad (5A),$$

$$\beta \cdot P2 = \beta \cdot N2 \cdot px < \lambda/NA \quad (5B)$$

From these conditions, the conditions of the integers N1, N2 are obtained as follows. It is noted, however, that β·px (the width of the images of the mirror elements 30) is denoted by D.

$$N1 < \lambda/(NA \cdot D) \quad (6A),$$

$$N2 < \lambda/(NA \cdot D) \quad (6B)$$

As an example, when λ=193 nm, NA=1.35 (in application of the liquid immersion method), and D=β·px=20 (nm), the right-hand sides of Expressions (6A) and (6B) are approximately 7.15 and thus the conditions that the phase patterns of the pitches P1, P2 are not resolved by the projection optical system PL are that the integers N1, N2 are not more than 7 as follows.

$$N1 \leq 7 \quad (7A),$$

$$N2 \leq 7 \quad (7B)$$

Furthermore, in FIG. 4B, when the number of mirror elements 30A of the phase 0 in a pitch P1 in the first boundary region 38A is n1 (n1 is an integer smaller than N1) and the number of mirror elements 30 of the phase π in a pitch P2 in the second boundary region 38B is n2 (n2 is an integer smaller than N2), a condition for forming the phase pattern MP1A equivalent to the phase distribution having the boundary line BR1 resulting from the shift of the boundary line BR by Δy is as given below, using the Y-directional width of the boundary regions 38A, 38B (which is the same as the Y-directional width of the mirror elements 30 herein) py.

$$\Delta y = \{-(n1/N1) + (n2/N2)\} py \quad (8A)$$

Figure 4D:
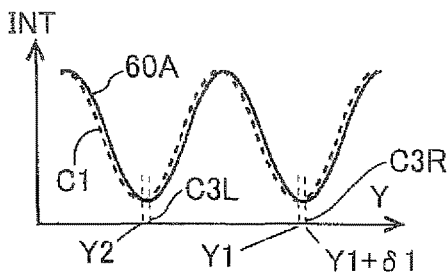

Furthermore, the shift amount δ1 from the position Y1 of the position where the intensity profile 60A of FIG. 4D corresponding to the shift amount Δy is minimum is as given below, using the projection magnification β. It is noted herein, however, that β·py (the Y-directional width of the images of the mirror elements 30) is represented by D.

$$\delta 1 = \{-(n1/N1) + (n2/N2)\} D \quad (8B)$$

In the present embodiment, the shift amount Δy of the boundary line BR1 in the phase distribution equivalent to phase pattern MP1A and, in turn, the shift amount δ1 of an image conjugate with the boundary line BR1 are adjusted by changing at least one of values of the integers N1, N2 and the integers n1, n2, within the ranges in which the integers N1, N2 defining the pitches P1, P2 satisfy Expressions (6A) and (6B). In addition, when no consideration is given to OPE (Optical Proximity Error) or the like being the error due to optical proximity effect, the pitch P1 and the pitch P2 are different in principle in the case of the two boundary regions 38A, 38B being used. Namely, if the pitches P1, P2 are equal, one of the boundary regions 38A, 38B will be omitted because either of the phase-0 mirror elements 30A and the phase-π mirror elements 30D are omitted by cancellation.

As an example, where the width D of the images of the mirror elements 30 is 20 nm and where the shift amount δ1 is set to 1 nm, the integers may be set as N1=5, n1=1, N2=4, and n2=1, as shown in FIG. 4B. By substituting these values in Expression (8B), the shift amount δ1 is calculated to be 1 nm as follows.

$$\delta 1 = (-\tfrac{1}{5} + \tfrac{1}{4}) 20 = 1 \text{ (nm)} \quad (9A)$$

In the present embodiment, the −Y-directional boundary line BL1 of the phase distribution equivalent to the phase pattern MP1A of FIG. 4B is moved by Δy where the sign is positive on the first pattern region 37C side with respect to the original boundary line BL. For this reason, in the phase pattern MP1A, a phase distribution of a third boundary region 39A consisting of the mirror elements 30 in one column arranged adjacent in the +Y-direction to the second pattern region 37D is a distribution obtained by inverting the phase distribution of the first boundary region 38A and a phase distribution of a fourth boundary region 39B consisting of the mirror elements 30 in one column arranged adjacent in the +Y-direction to the third boundary region 39A (or arranged adjacent in the −Y-direction to the first pattern region 37C) is a distribution obtained by inverting the phase distribution of the second boundary region 38B. A boundary between the boundary regions 39A, 39B is the boundary line BL before the shift of the phase pattern.

Specifically, in the case of N1=5, n1=1, N2=4, and n2=1, the mirror elements 30 in the third boundary region 39A are set as follows: a plurality of mirror elements 30B arranged at the pitch 5px and with the width px in the X-direction are set in the phase π and the other mirror elements 30A are set in the phase 0. Furthermore, in the fourth boundary region 39B, a plurality of mirror elements 30C arranged at the pitch 4px and with the width px in the X-direction are set in the phase 0 and the other mirror elements 30D are set in the phase π. By using this phase pattern MP1A, we can form a spatial image obtained by shifting the spatial image of the phase pattern MP1 of FIG. 4A by 1 nm in the Y-direction.

Figure 5A:
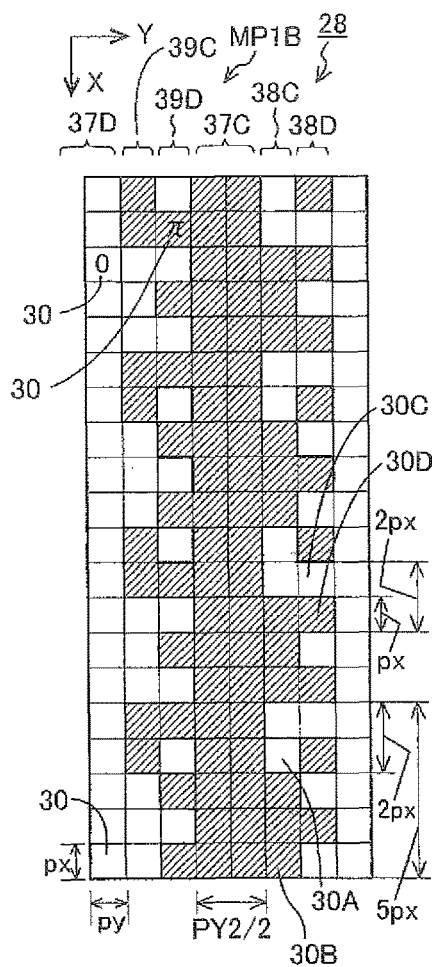
FIG. 5A, FIG. 5B, and FIG. 5C are partially enlarged plan views respectively showing other examples of phase distributions of reflected light set by the spatial light modulator, and FIG. 5D, FIG. 5E, and FIG. 5F drawings showing intensity profiles of spatial images corresponding to the phase distributions of FIG. 5A, FIG. 5B, and FIG. 5C, respectively.
Figure 5B:
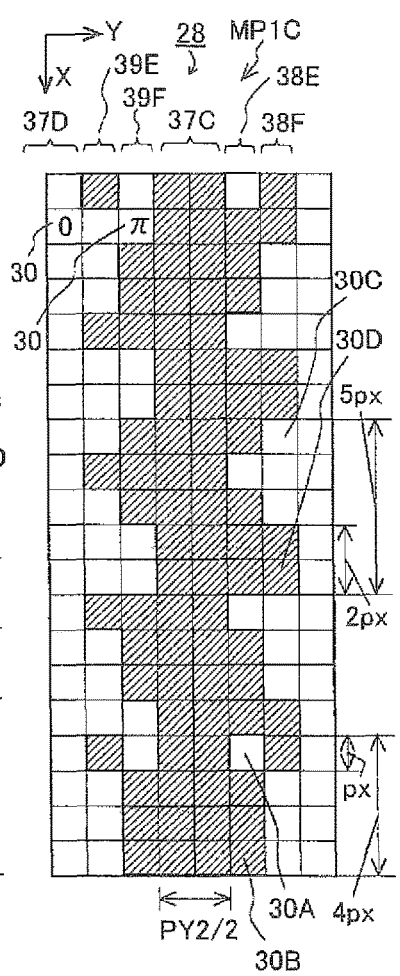
Figure 5C:
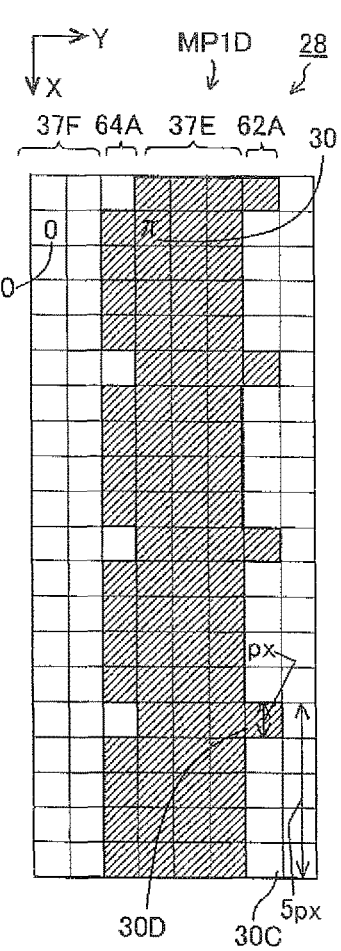
Figure 5D:
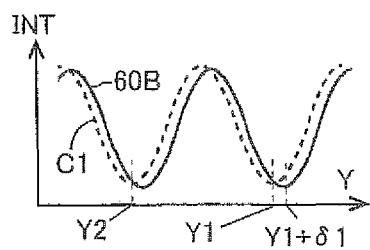
Figure 5E:
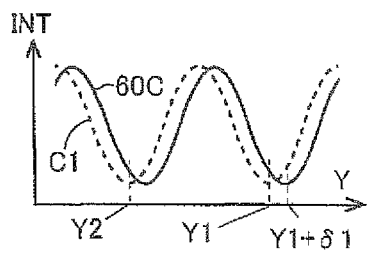
Figure 5F:
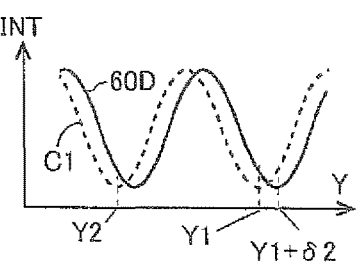

Similarly, an intensity profile 60B of FIG. 5D, an intensity profile 60C of FIG. 5E, and an intensity profile 60D of FIG. 5F obtained by shifting the intensity distribution C1 of the image of the phase pattern MP1 of FIG. 4A by 2 nm, 3 nm, and 4 nm in the Y-direction can be formed by setting the phase distribution of the array of mirror elements 30 of the spatial light modulator 28 to a phase pattern MP1B of FIG. 5A, a phase pattern MP1C of FIG. 5B, and a phase pattern MP1D of FIG. 5C, respectively. In the phase pattern MP1B of FIG. 5A, the mirror elements 30 in a first boundary region 38C next in the +Y-direction to the first pattern region 37C are set so that a plurality of mirror elements 30A arranged at the pitch 5px and with the width 2px in the X-direction are set in the phase 0 (the first state) and so that the other mirror elements 30B are set in the phase π (the second state); the mirror elements 30 in a second boundary region 38D next to the first boundary region 38C are set so that a plurality of mirror elements 30D arranged at the pitch 2px and with the width px in the X-direction are set in the phase π and so that the other mirror elements 30C are set in the phase 0. Furthermore, phase distributions of a third boundary region 39C adjacent in the +Y-direction to the second pattern region 37D and a fourth boundary region 39D adjacent in the +Y-direction to the third boundary region 39C (or adjacent in the −Y-direction to the first pattern region 37C) are distributions obtained by inverting the distributions of the boundary regions 38C and 38D, respectively. Since this phase distribution is equivalent to a distribution obtained with N1=5, n1=2, N2=2, and n2=1 in FIG. 4B, the shift amount δ1 is calculated to be 2 nm as below from Expression (8B).

$$\delta 1=(-\tfrac{2}{5}+\tfrac{1}{2})20=2 \text{ (nm)} \quad (9B)$$

Furthermore, the phase pattern MP1C of FIG. 5B is one based on the following setting: in a first boundary region 38E next to the +Y-direction to the first pattern region 37C, a plurality of mirror elements 30A arranged at the pitch 4*px* and with the width px in the X-direction are set in the phase 0 and the other mirror elements 30B are set in the phase π; in a second boundary region 38F next to the foregoing region 38E, a plurality of mirror elements 30D arranged at the pitch 5*px* and with the width 2*px* in the X-direction are set in the phase π and the other mirror elements 30C are set in the phase 0. Furthermore, phase distributions of a third boundary region 39E and a fourth boundary region 39F successively adjacent in the +Y-direction to the second pattern region 37D are distributions obtained by inverting the distributions of the boundary regions 38E and 38F, respectively. Since this phase distribution is equivalent to a distribution with N1=4, n1=1, N2=5, and n2=2 in FIG. 4B, the shift amount δ1 is calculated to be 3 nm from Expression (8B).

Furthermore, in the phase pattern MP1D of FIG. 5C, the mirror elements 30 in a boundary region 62A adjacent in the +Y-direction to a first pattern region 37E consisting of three columns of mirror elements 30 of the phase π are set so that a plurality of mirror elements 30D arranged at the pitch 5*px* and with the width px in the X-direction are set in the phase π and the other mirror elements 30C are set in the phase 0, and a phase pattern of a boundary region 64A adjacent in the +Y-direction to a boundary region 37F consisting of three columns of mirror elements 30 of the phase 0 (or adjacent in the −Y-direction to the first pattern region 37E) is set to a distribution obtained by inverting the distribution of the boundary region 62A. Since this phase distribution is equivalent to a distribution obtained with n1=0, N2=5, and n2=1 in FIG. 4B, the shift amount δ1 is calculated to be 4 nm from Expression (8B). Similarly, by adjusting the values of the integers N1, n1, N2, and n2 in Expression (8B), we can form phase patterns with intensity distributions obtained by shifting the intensity distribution of the image of the phase pattern MP1 of FIG. 4A by steps of 1 nm or approximately 1 nm from 5 nm to 19 nm in the Y-direction.

Figure 6B:
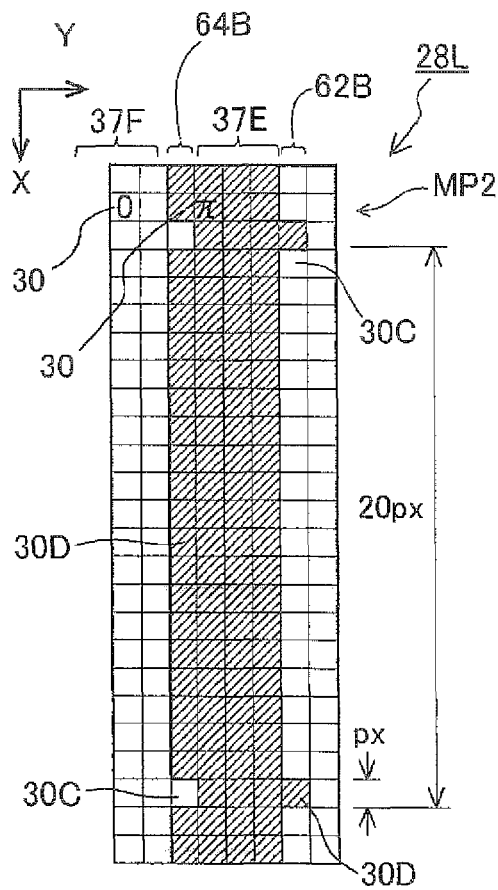
Figure 6C:
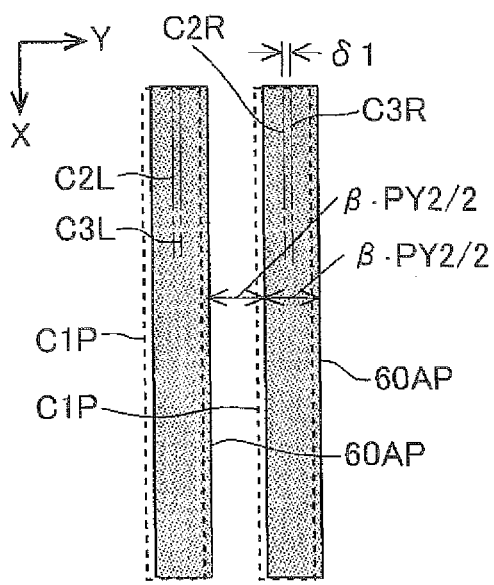
Figure 6D:
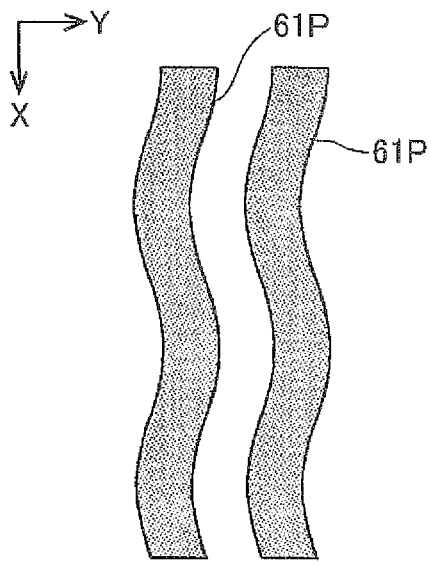

Furthermore, if the wafer W is exposed with the spatial image of the phase pattern MP1A of FIG. 4B, we will obtain two line patterns 60AP parallel to the X-axis, consisting of resist patterns with center lines C3R, C3L shifted by δ1 in the Y-direction with respect to the center lines C2R, C2L of the line patterns C1P obtained from the spatial image of the phase pattern MP1 of FIG. 4A, as shown in FIG. 6C. The center lines C3R and C3L of the line patterns 60AP are conjugate with the boundary lines BR1 and BL1, respectively, of the phase distribution equivalent to the phase pattern MP1A of FIG. 4B (or they are images of the boundary lines BR1 and BL1).

Furthermore, FIG. 6A shows a phase pattern MP1A obtained by setting N1=5, n1=1, N2=4, and n2=1 in the phase pattern MP1A of FIG. 4B. Therefore, when the wafer is exposed with the spatial image of the phase pattern MP1A of FIG. 6A and developed, we obtain the line patterns 60AP with the shift amount δ1 of 1 nm in FIG. 6C. It is noted herein, however, that the width D of the images of the mirror elements 30 is assumed to be 20 nm. In contrast to it, it can also be contemplated that the shift amount of 1 nm is achieved, as indicated by a phase pattern MP2 set in the spatial light modulator 28L in the comparative example of FIG. 6B, by the following setting: in a boundary region 62B adjacent in the +Y-direction to the first pattern region 37E consisting of three columns of mirror elements 30 of phase π, a plurality of mirror elements 30D arranged at the pitch 20*px* and each with the width px in the X-direction are set in the phase π and the other mirror elements 30C are set in the phase 0; and a phase distribution of a boundary region 64B adjacent in the −Y-direction to the first pattern region 37E is set to a distribution obtained by inverting the distribution of the boundary region 62A.

Since the phase pattern MP2 of FIG. 6B is equivalent to a distribution with n1=0, N2=20, and n2=1 in FIG. 4B, the shift amount δ1 is calculated to be 1 nm from Expression (8B). However, since the value 20 of the integer N2 exceeds the upper limit 7 of Expression (7B) which is the limitation of resolution by the projection optical system PL, images of the boundary regions 62B and 64B are transferred by exposure onto the wafer W. For this reason, a resist pattern obtained by the exposure with the spatial image of the phase pattern MP2 is of a periodically undulating shape in the X-direction, as indicated by two resist patterns in FIG. 6D, so as to result in degradation of pattern fidelity, which is not preferable.

In the present embodiment, for example, the two boundary regions 38A, 38B and/or 39A, 39B are provided in the phase pattern MP1A as shown in FIG. 4B, whereby, while satisfying the conditions of not being resolved by the projection optical system PL (e.g., Expressions (7A) and (7B)), the Y-directional shift amount of resulting line patterns can be set to a small amount, e.g., approximately 1⁄20 or less of the width D of the images of the mirror elements 30.

Next, let us assume that a line-and-space pattern (which will be referred to hereinafter as L&S pattern) in which line patterns extending in the X-direction are arranged at a pitch equal to a non-integral multiple of the width of the images of the mirror elements 30 in the Y-direction, is formed on the surface of the wafer W. The illumination condition in this case is also set, for example, to small σ illumination with the σ value of about 0.14 and the polarization condition is also set so that the polarization direction of the illumination light IL is the X-direction (the longitudinal direction of line patterns) on the wafer W. Let us consider a situation in which the L&S pattern is formed at the pitch of 78 nm on the wafer W, in the assumption that the width D of the images of the mirror elements 30 is 20 nm.

Figure 7A:
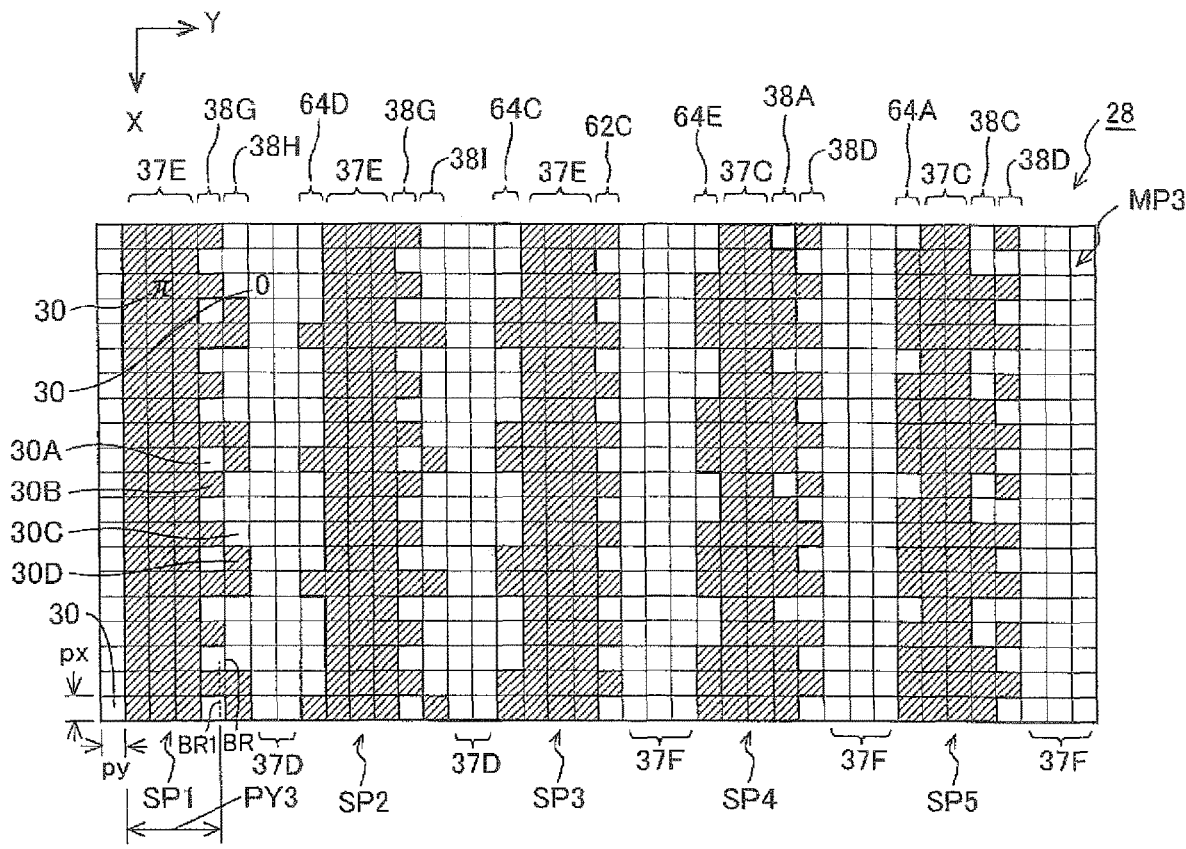
FIG. 7A is a partially enlarged plan view showing an example of a phase distribution of reflected light set by the spatial light modulator for forming an L&S pattern, and FIG. 7B a drawing showing an intensity profile of a spatial image corresponding to the phase distribution of FIG. 7A.

For this, the array of mirror elements 30 of the spatial light modulator 28 is used to generate, as shown in the partially enlarged plan view of FIG. 7A, a phase pattern MP3 including a first partial pattern SP1 including the mirror elements 30 in seven columns in the Y-direction and a plurality of rows (e.g., 20 or more rows) in the X-direction, and second, third, fourth, and fifth partial patterns SP2, SP3, SP4, and SP5 arranged successively adjacent in the +Y-direction to this first partial pattern SP1 and including the mirror elements 30 in eight columns in the Y-direction and a plurality of rows (e.g., 20 or more rows) in the X-direction. The mirror elements 30 in a region adjacent in the −Y-direction to the first partial pattern SP1 are set in the phase 0. In FIG. 7A portions corresponding to those in FIGS. 4A to 5C are denoted by the same reference signs, while omitting the detailed description thereof.

In the phase pattern MP3 of FIG. 7A, the first partial pattern SP1 has the first pattern region 37E consisting of an array of three columns of mirror elements 30 of the phase π in the Y-direction, a first boundary region 38G arranged adjacent in the +Y-direction to the foregoing region 37E and having the mirror elements 30A of the phase 0 (the first state) with the width px arranged at the pitch 2px in the X-direction and the other mirror elements 30B of the phase π (the second state), a second boundary region 38H arranged adjacent in the +Y-direction to the foregoing region 38G and having the mirror elements 30D of the phase π (the second state) with the width 2px (two elements) arranged at the pitch 5px in the X-direction and the other mirror elements 30C of the phase 0, and the second pattern region 37D arranged adjacent in the +Y-direction to the foregoing region 38H and consisting of an array of mirror elements 30 of the phase 0 in two rows in the Y-direction. In this case, the pitches of arrangements of the mirror elements 30A, 30D are values not resolved by the projection optical system PL and, with the setting of N1=2, n1=1, N2=5, and n2=2 in Expression (8B), the shift amount δ1 in the −Y-direction of the image of the boundary region BR1 in an equivalent phase distribution (a distribution in which the phase in the −Y-direction of the boundary line BR1 is π and the phase in the +Y-direction thereof is 0) with respect to the image of the boundary line BR between the boundary regions 38G, 38H is 2 nm.

Figure 7B:
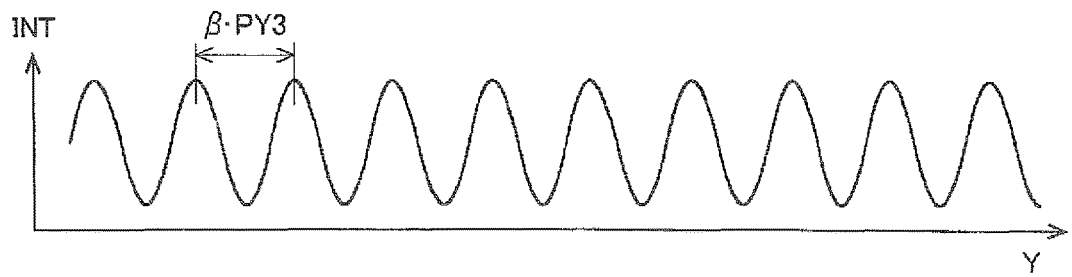

Furthermore, a value β·PY3, which is a value obtained multiplying a distance between the −Y-directional end of the first pattern region 37E and the boundary line BR1 by the projection magnification β, is 78 nm and this value β·PY3 is the Y-directional pitch of the L&S pattern formed on the wafer W. Furthermore, the second, third, fourth, and fifth partial patterns SP2, SP3, SP4, and SP5 have boundary regions 64D, 64C, 64E, and 64A, respectively, arranged adjacent in the −Y-direction to the first pattern region 37E or 37C and serving for shifting an image of a boundary line in an equivalent phase distribution by 4 nm, 8 nm, 12 nm, and 16 nm in the −Y-direction, and boundary regions 38G, 38I, a boundary region 62C, boundary regions 38A, 38D, and boundary regions 38C, 38D, respectively, arranged adjacent in the +Y-direction to the first pattern region 37E or 37C and serving for shifting an image of a boundary line in an equivalent phase distribution by 6 nm, 10 nm, 14 nm, and 18 nm in the −Y-direction. This causes the intensity INT of the spatial image of the phase pattern MP3 to have the distribution of the L&S pattern in which the pitch β·PY3 is equally 78 nm as shown in FIG. 7B. Therefore, when the accuracy of the pitch of the L&S pattern is regarded as one of shape accuracies, the periodical pattern can be formed with shape accuracy finer than the width of the images of the mirror elements 30 of the spatial light modulator 28.

Next, let us explain, with reference to the flowchart of FIG. 8, an example of an exposure method including a drive method for the spatial light modulator 28 in a case where a pattern is formed with position accuracy and/or shape accuracy finer than the image of the width of the mirror elements 30 of the spatial light modulator 28, in the exposure apparatus EX in FIG. 1. First, in step 102 in FIG. 8, the wafer W coated with a photoresist is loaded on the wafer stage WST of the exposure apparatus EX and in next step 104, the main control system 40 reads information of an entire phase distribution to be set in the spatial light modulator (SLM) 28, from an exposure data file and supplies the read information to the modulation control unit 48. In next step 106 Y-directional scanning of the wafer stage WST is started and when the leading end of a shot area as an exposure target on the wafer W reaches a portion to be the exposure region 26B, information of relative position of the shot area is supplied from the main control system to the modulation control unit 48.

In next step 108, the modulation control unit 48 reads a partial phase distribution of a region to be transferred (transfer target region) to the exposure region 26B, out of the data of the entire phase distribution. In next step 110, the modulation control unit 48 sets the mirror elements 30 in the first state (phase 0) or in the second state (phase π) corresponding to the partial phase distribution, in units of the mirror elements 30 of the spatial light modulator 28. In the case of the transfer target phase distribution being FIG. 4B, this step results in setting the mirror elements 30 in the first pattern region 37C in the phase π and setting the mirror elements 30 in the second pattern region 37D in the phase 0.

In next step 112, the modulation control unit 48 determines whether the partial phase distribution includes a boundary line (a boundary line between a region of the phase 0 and a region of the phase π) set inside the width of the mirror elements 30 and, without inclusion of the boundary line, the operation shifts to step 120. On the other hand, when the partial phase distribution includes the boundary line set inside the width of the mirror elements 30, the operation shifts to step 114. In step 114, the modulation control unit 48 sets a plurality of mirror elements 30A at the first pitch P1 in the phase 0 and the other mirror elements 30B in the phase π in the first boundary region 38A (first region) out of a region where the boundary line passes and a region adjacent to this region (a region near the boundary line) (the boundary regions 38A, 38B and 39A, 39B where the boundary lines BR1, BL1 pass, in the example of FIG. 4B).

In next step 116, the modulation control unit 48 sets a plurality of mirror elements 30D at the second pitch P2 in the phase π and the other mirror elements 30C in the phase 0 in the second boundary region 38B (second region) in FIG. 4B. It is noted that if the shift of the boundary line BR to the boundary line BR1 can be implemented by only adjusting the phase distribution of mirror elements 30 in one boundary region, step 116 can be omitted. In next step 118, the modulation control unit 48 sets phase distributions of the third boundary region 39A (third region) and the fourth boundary region 39B (fourth region) to distributions (opposite distributions) obtained by inverting the distributions of the boundary regions 38A and 38B, respectively. It is noted that if the boundary line BL1 coincides with the boundary line BL, step 118 can be omitted. Furthermore, if the shift amount of the boundary line BL1 with respect to the boundary line BL is different from the shift amount of the boundary line BR1, the operation of step 118 is independently carried out in the same manner as step 114 (or steps 114, 116).

In next step 120, the main control system 40 supplies a predetermined number of pulses of illumination light IL from the light source 2 through the illumination optical system ILS to the spatial light modulator 28. By this, exposure is implemented to transfer a spatial image corresponding to the phase distribution set in the spatial light modulator 28, to the wafer W. If the scanning exposure is not completed in next step 122, the operation shifts to step 124, in which the main control system 40 supplies updated information of relative position of the exposure target shot area to the exposure region 26B. In accordance therewith, the modulation control unit 48 shifts the transfer target region of the entire phase distribution in the direction corresponding to the scanning direction. Thereafter, the operation returns to step 108 and in steps 108 to 120, exposure is implemented to transfer a spatial image corresponding to a partial phase distribution in the shifted transfer target region to the wafer W. This exposure operation is continued until the scanning exposure is completed in step 122.

As described above, the present embodiment allows the isolated linear spatial image or the spatial image of the L&S pattern to be formed each with position accuracy or shape accuracy finer than the width of the images of the mirror elements 30 in the maskless method. Therefore, a variety of patterns (spatial images) can be formed with high accuracy on the surface of the wafer W.

The effects and others of the present embodiment are as described below.

The exposure apparatus EX of the present embodiment is provided with the spatial light modulator 28 and the modulation control unit 48. Furthermore, the drive method for the spatial light modulator 28 by the modulation control unit 48 is the method for driving the spatial light modulator 28 having the array of the plurality of mirror elements 30 (optical elements) each of which guides the illumination light IL to the projection optical system PL. This drive method has: step 114 of, out of the first boundary region 38A and the second boundary region 38B arranged adjacently in the Y-direction (first direction) and each extending in the X-direction (second direction) perpendicular to the Y-direction, setting a plurality of mirror elements 30A arranged at the pitch P1 not resolved (or exceeding the resolution limit) by the projection optical system PL, in the X-direction in the first boundary region 38A, in the state of the phase 0 (first state) and setting the other mirror elements 30B in the state of the phase $\pi$ (second state); and step 116 of setting a plurality of mirror elements 30D arranged at the pitch P2 not resolved by the projection optical system PL, in the X-direction in the second boundary region 38B, in the state of the phase $\pi$ and setting the other mirror elements 30C in the state of the phase 0.

This drive method for the spatial light modulator 28 is also a method for generating a pattern for exposure. Here, the array of the plurality of mirror elements 30 (optical elements) of the spatial light modulator 28 can be regarded as a plurality of sections arranged in a grid pattern and the arrangement of the plurality of mirror elements 30 (sections) of the spatial light modulator 28 set in the first state (phase 0) and the second state (phase $\pi$) can be regarded as a pattern for exposure.

According to the present embodiment, the spatial light modulator 28 is controlled so that a plurality of mirror elements 30A arranged at the pitch P1 in the first boundary region 38A are set in the phase 0 and a plurality of mirror elements 30D arranged at the pitch P2 in the second boundary region 38B are set in the phase $\pi$, whereby the image of the boundary line BR between the boundary regions 38A, 38B is shifted with position accuracy finer than the width D of the images of the mirror elements 30 in the Y-direction, substantially based on Expression (8B). Therefore, when a pattern is projected onto the wafer W with the use of the spatial light modulator 28, the pattern can be formed with position accuracy or shape accuracy finer than the width of the images of the mirror elements 30.

Furthermore, since the arrangement pitches of the mirror elements 30A, 30B are those not resolved by the projection optical system PL, linearity of line patterns is maintained in forming the line patterns on the wafer W and, by setting the phases of the mirror elements 30A, 30D arranged at the different pitches P1, P2 in the two adjacent boundary regions 38A, 38B, the shift amount of the image of the boundary line BR can be controlled with finer accuracy.

Furthermore, the exposure apparatus EX is the exposure apparatus for exposing the wafer W (substrate) with the illumination light IL (exposure light) via the projection optical system PL, and is provided with the spatial light modulator 28 arranged on the object plane side of the projection optical system PL and having the array of the plurality of mirror elements 30 each of which can be controlled so as to guide the illumination light IL to the projection optical system PL, and the modulation control unit 48 (control device) for driving the plurality of mirror elements 30 of the spatial light modulator 28. Then, the modulation control unit 48 sets the mirror elements 30 as follows in accordance with the spatial image to be formed through the projection optical system PL on the surface of the wafer W; out of the boundary regions 38A and 38B arranged adjacently in the Y-direction, the modulation control unit 48 sets a plurality of mirror elements 30A arranged at the pitch P1 not resolved by the projection optical system PL, in the X-direction in the first boundary region 38A, in the state of the phase 0 and the other mirror elements 30B in the state of the phase $\pi$; the modulation control unit 48 sets a plurality of mirror elements 30D arranged at the pitch P2 not resolved by the projection optical system PL, in the X-direction in the second boundary region 38B, in the state of the phase $\pi$ and the other mirror elements 30C in the state of the phase 0.

Therefore, when a pattern is projected onto (or formed on) the wafer W with the use of the spatial light modulator 28, the pattern (resist pattern or the like) can be formed with position accuracy or shape accuracy finer than the width of the images of the mirror elements 30.

It is noted that step 116 and step 118 can be executed substantially at the same time. Furthermore, step 118 can also be executed prior to step 116. Moreover, the present embodiment can also be applied to a case of setting a phase distribution equivalent to a phase distribution in which a region of the phase 0 and a region of the phase $\pi$ are separated by a boundary line shifted by an amount substantially finer than the width of the mirror elements 30 in the X-direction, with respect to a boundary line parallel to the Y-axis of the array of mirror elements 30 (a region between the mirror elements 30). In this case, we can set a plurality of mirror elements 30 arranged at a pitch not resolved by the projection optical system PL, in the phase of 0 or $\pi$ in two boundary regions adjacent in the X-direction, in the array of mirror elements 30.

Furthermore, the spatial light modulator 28 has high utilization efficiency of the illumination light IL because it has the mirror elements 30 (reflective elements) as optical elements. However, it is also possible to use a transmission type spatial light modulator in which each of individual optical elements changes the phase of transmitted light by predetermined $\phi 1$ or $(\phi 1+180°)$, instead of the spatial light modulator 28. Such optical elements to be used can be electrooptic elements which change the refractive index depending upon voltage, or liquid crystal cells, or the like.

Furthermore, the exposure method of the exposure apparatus EX of the present embodiment is the exposure method for exposing the wafer W (substrate) with the illumination light IL (exposure light) via the spatial light modulator 28 having the array of mirror elements 30 and via the projection optical system PL, the exposure method having: steps 114, 116 of setting at least a partial set of the plurality of mirror elements 30 (the mirror elements 30 in the illumination region 26A) in the state of the phase 0 or $\pi$ by the foregoing drive method for the spatial light modulator 28; and step 120 of exposing the wafer W with the spatial image formed with the illumination light IL via the plurality of mirror elements 30 set in the state of the phase 0 or π and via the projection optical system PL.

The exposure method or the exposure apparatus EX enables a finer and complicated pattern to be formed in the maskless method because the pattern (spatial image) can be formed with accuracy finer than the width of the images of the mirror elements 30.

It is noted that each of the mirror elements 30 of the spatial light modulator 28 may be configured so that it can be set in a plurality of states, for example, including a third state (a state in which the phase is changed by π/2, or the like) except for the state of the phase 0 (the first state) and the state of the phase π (the second state).

Furthermore, the illumination light IL from the illumination optical system ILS is obliquely incident approximately at the incidence angle α to the plurality of mirror elements 30 (reflective elements) and the reflected light from the mirror elements 30 is incident to the projection optical system PL so as to intersect with the optical axis AXW of the projection optical system PL. Therefore, the projection optical system PL is non-telecentric on the object plane side and, for this reason, the whole of the reflected light from the spatial light modulator 28 can be applied via the projection optical system PL onto the wafer W, achieving high utilization efficiency of the illumination light IL. Furthermore, the polarization state of the illumination light IL set by the polarization control optical system 6 can be accurately reproduced on the surface of the wafer W.

Furthermore, the mirror elements 30 are provided in the rectangular region the longitudinal direction of which is the X-direction (the second direction), the exposure apparatus EX is provided with the wafer stage WST (substrate stage) for moving the wafer W in the scanning direction corresponding to the Y-direction (first direction) perpendicular to the X-direction on the image plane of the projection optical system PL, and the modulation control unit 48 moves the pattern (phase distribution) formed by the plurality of mirror elements 30, in the Y-direction, in accordance with movement of the wafer W by the wafer stage WST. This enables efficient exposure over the entire surface of the wafer W.

In addition, the foregoing embodiment can be modified as described below.

Figure 9A:
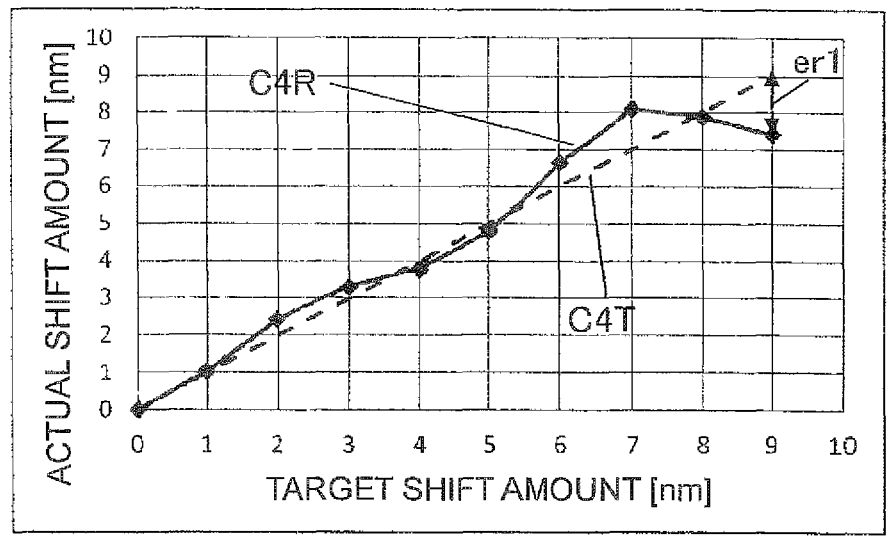
FIG. 9A is a drawing showing an example of relationship between target shift amount and actual shift amount of a predetermined pattern, and FIG. 9B a drawing showing an example of relationship between target shift amount and actual shift amount of a predetermined pattern in a first modification example.

In the array of mirror elements 30 of the spatial light modulator 28 in the above embodiment, the phase distribution equivalent to the phase distribution in which the phase is it in the −Y-direction and the phase is 0 in the +Y-direction of the boundary line BR1 shifted by Δy in the Y-direction with respect to the boundary line BR between the boundary regions 38A, 38B can be generated by adjusting the integers N1, N2 defining the pitches P1, P2 of the mirror elements 30A, 30D of the phase 0 or π in the boundary region 38A and/or 38B and the integers n1, n2 defining the numbers of mirror elements 30A, 30D in one pitch, as shown in FIG. 4B. In this case, we determined by simulations, intensity distributions formed on the image plane with the illumination light IL from the phase pattern MP1A of FIG. 4B via the projection optical system PL, for example, with consideration to OPE (Optical Proximity Error) being the error by the optical proximity effect and the like, and obtained shift amounts (actual shift amounts) of the intensity distributions from the intensity distribution C1 as a reference of FIG. 4D, and the actual shift amounts were found to have some error from values (target shift amounts) calculated by substituting the values of the integers N1, N2 and n1, n2 in Expression (8B), as shown in FIG. 9A. In FIG. 9A, a dotted straight line C4T indicates the same values as the target shift amounts (nm) on the vertical axis and a solid broken line C4R indicates actual shift amounts (nm) relative to the target shift amounts. Therefore, a difference of the broken line C4R from the straight line C4T is an error er1 of shift amount. The error er1 takes a maximum of 1.6 nm, particularly, at the target shift amount of 9 nm.

Figure 10A:
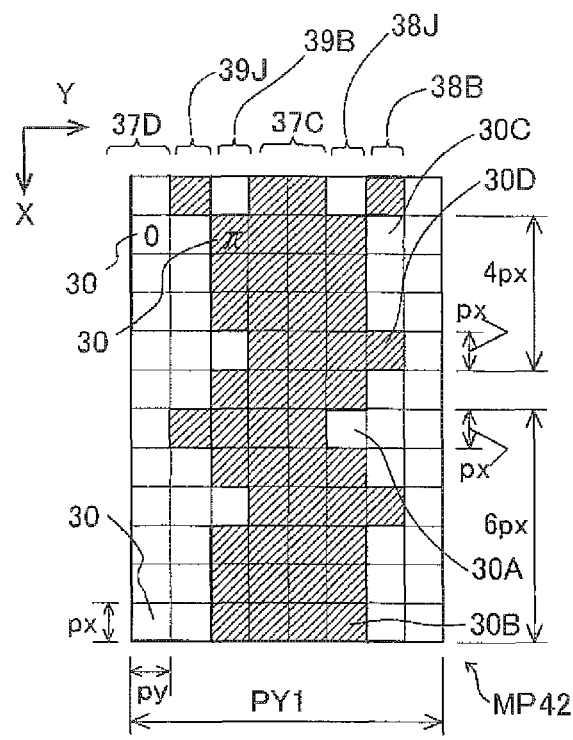
FIG. 10A, FIG. 10B, FIG. 10C, and FIG. 10D are partially enlarged plan views respectively showing examples of phase distributions of reflected light set by the spatial light modulator in the first modification example.
Figure 10B:
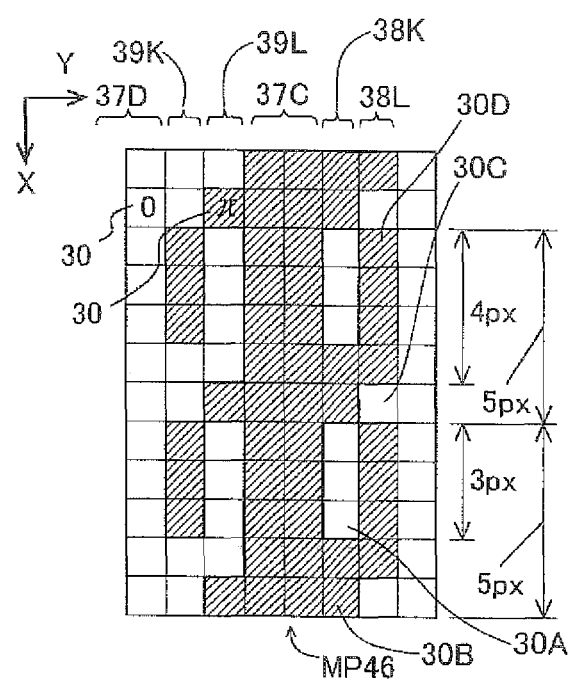

Then, a first modification example of the present embodiment is configured to change the pitches P1, P2 (integers N1, N2) of the mirror elements 30A, 30D of the phase 0 or π in two adjacent boundary regions and the numbers (integers n1, n2) of the mirror elements 30A, 30D in one pitch, while maintaining the condition of being not resolved by the projection optical system PL, so that the actual shift amount of the intensity distribution of the spatial image becomes as close to the target shirt amount as possible, for example, as shown in examples of FIGS. 10A to 10D. A phase pattern MP42 with the actual shift amount of 2 nm in FIG. 10A is a distribution obtained by setting N1=6 and n1=1 in a first boundary region 38J adjacent in the +Y-direction to the first pattern region 37C, setting N2=4 and n2=1 in a second boundary region 38B adjacent to the region 38J, and setting phase distributions of boundary regions 39J, 39B on the −Y-directional side of the first pattern region 37C to distributions obtained by inverting the distributions of the boundary regions 38J, 38B. The shift amount of the phase pattern MP42 calculated from Expression (8B) is approximately 1.7 (=+5−3.3) nm. Furthermore, a phase pattern MP46 with the actual shift amount of 6 nm in FIG. 10B is a distribution obtained by setting N1=5 and n1=3 in a first boundary region 38K adjacent in the +Y-direction to the first pattern region 37C, setting N2=5 and n2=4 in a second boundary region 38L adjacent to the region 38K, and setting phase distributions of boundary regions 39K, 39L on the −Y-directional side of the first pattern region 37C to distributions obtained by inverting the distributions of the boundary regions 38K, 38L. In this example, the integer N1 and the integer N2 are set equal and the shift amount calculated from Expression (8B) is approximately 4 (=+16−12) nm.

Figure 10C:
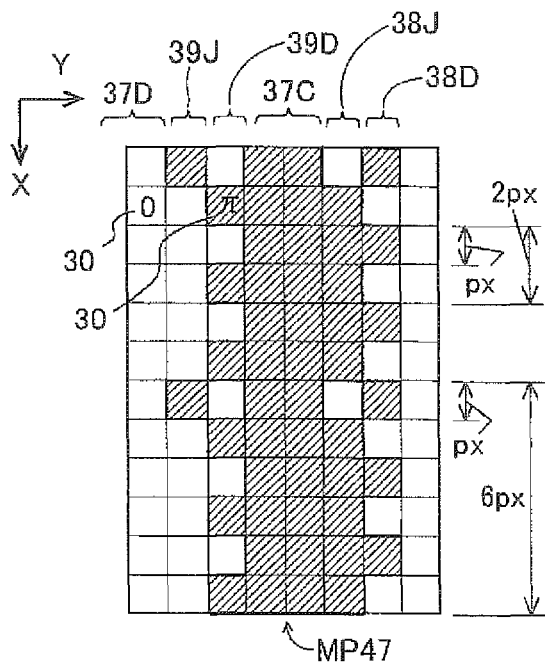
Figure 10D:
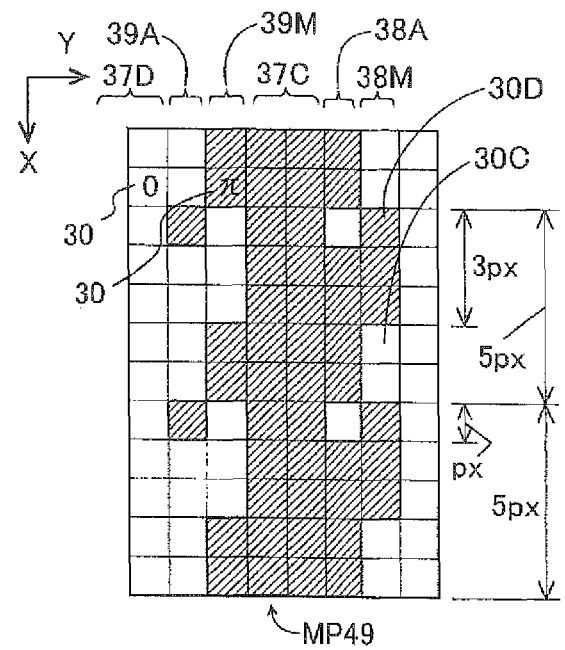

Similarly, a phase pattern MP47 with the actual shift amount of 7 nm in FIG. 10C is a distribution obtained by setting N1=6 and n1=1 in the first boundary region 38J adjacent in the +Y-direction to the first pattern region 37C, setting N2=2 and n2=1 in a second boundary region 38D adjacent to the region 38J, and setting phase distributions of boundary regions 39J, 39D on the −Y-directional side of the first pattern region 37C to distributions obtained by inverting the distributions of the boundary regions 38J, 38D. In this example, the shift amount calculated from Expression (8B) is approximately 6.66 (=+10−3.33) nm. Furthermore, a phase pattern MP49 with the actual shift amount of 9 nm in FIG. 10D is a distribution obtained by setting N1=5 and n1=1 in the first boundary region 38A adjacent in the +Y-direction to the first pattern region 37C, setting N2=5 and n2=3 in a second boundary region 38M adjacent to the region 38A, and setting phase distributions of boundary regions 39A, 39M on the −Y-directional side of the first pattern region 37C to distributions obtained by inverting the distributions of the boundary regions 38A, 38M. In this example, the integer N1 and the integer N2 are set equal and the shift amount calculated from Expression (8B) is approximately 8 (=+12−4) nm.

Figure 9B:
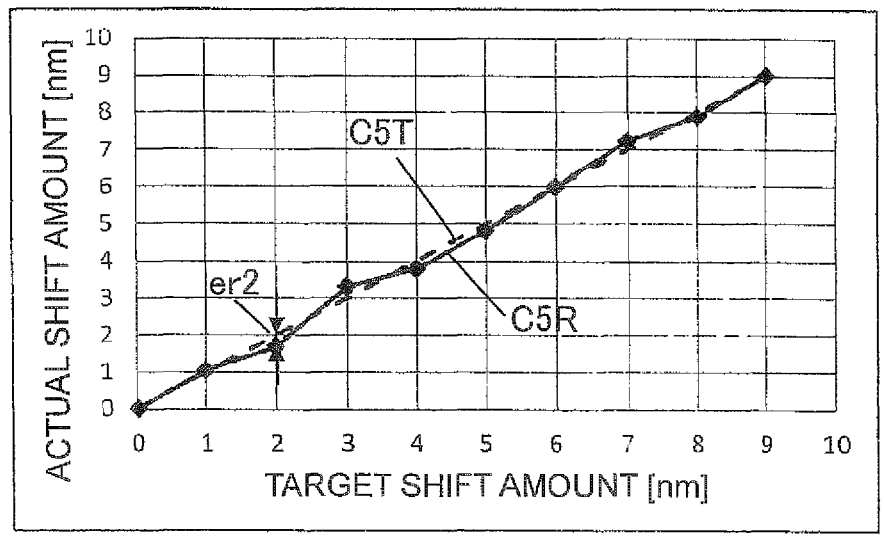

A dotted straight line C5T in FIG. 9B indicates the same values as the target shift amounts (nm) on the vertical axis and a solid broken line C5R the actual shift amounts (nm) in the case using the phase patterns MP42 to MP49 of FIGS. 10A to 10D with the shift amounts being 2 nm, 6 nm, 7 nm, and 9 nm and using phase patterns with shift amounts calculated by Expression (8B) for the other shift amounts.

Therefore, a difference of the broken line C5R from the straight line C5T is an error er2 of shift amount. The error er2 takes a maximum of 0.3 nm at the target shift amount of 2 nm and this error er2 is considerably smaller than the error er1 in FIG. 9A in the case without adjustment of the values of the integers N1, N2 and n1, n2. Therefore, this first modification example allows a target pattern to be formed with higher accuracy.

Figure 11A:
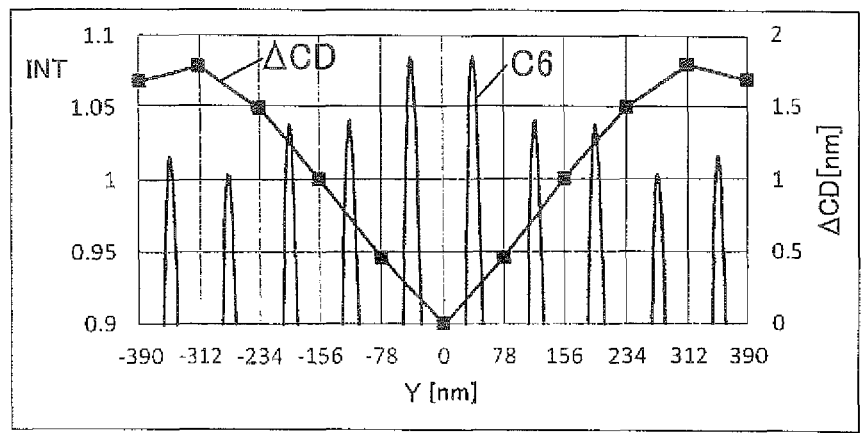
FIG. 11A is a drawing showing an intensity distribution and others of a spatial image of the phase distribution in FIG. 7A, and FIG. 11B a drawing showing an intensity distribution and others of a spatial image of a phase distribution in a second modification example.

Next, FIG. 11A shows the result of calculation by simulation of the intensity distribution of the spatial image of the L&S pattern formed using the phase pattern MP3 of FIG. 7A in the foregoing embodiment. In FIG. 11A, the horizontal axis represents Y-coordinates (nm) on the image plane, curves C6 ten peaks (bright lines) of intensity INT (relative values) in the L&S pattern, and a broken line ΔCD errors (nm) of line width CD (critical dimension) with respect to target values when resist patterns are formed with a threshold being set for the curves C6. It is seen from the curves C6 that there is variation in peak intensity of the spatial image of the L&S pattern and it is seen from the broken line ΔCD that variation in error of line width is approximately 2 nm.

Figure 12:
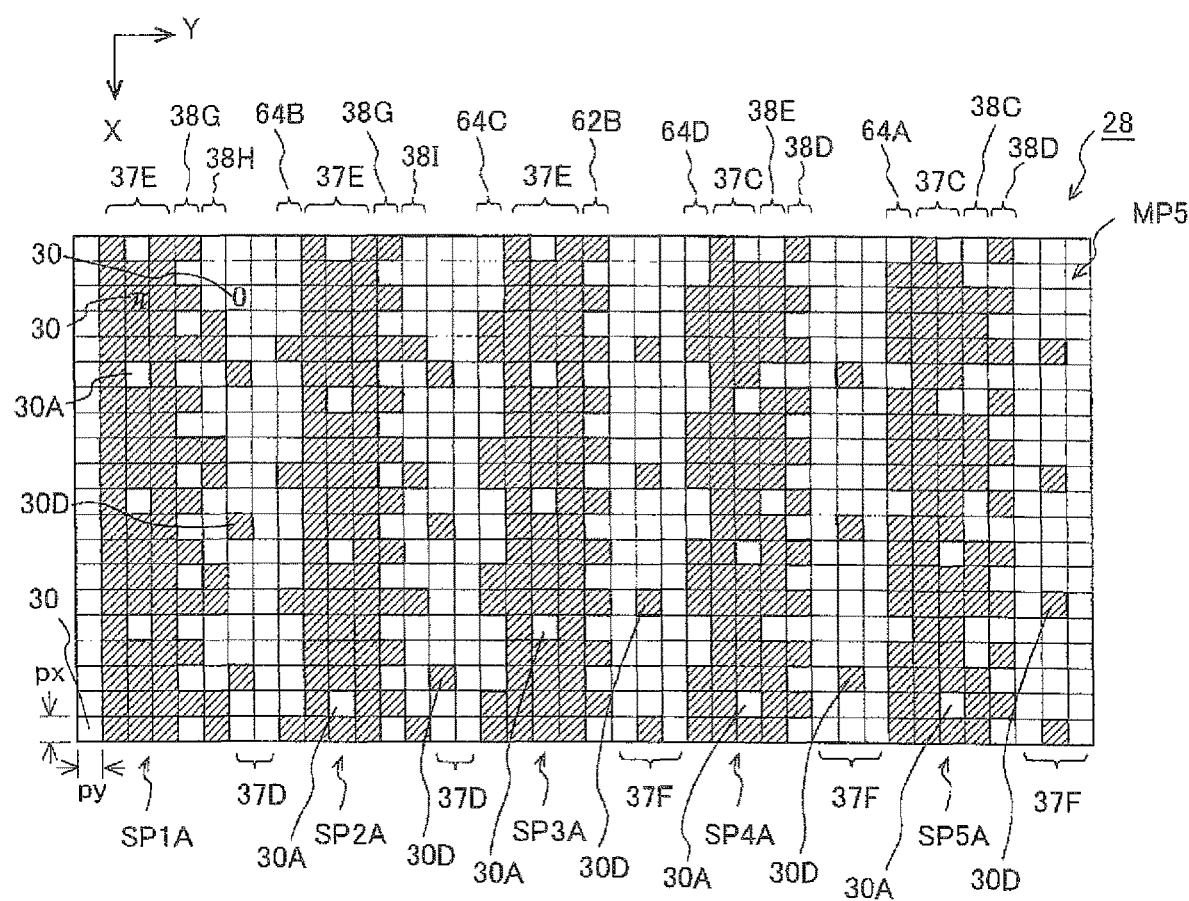
FIG. 12 is a partially enlarged plan view showing a phase distribution of reflected light set by the spatial light modulator in the second modification example.

Then, a second modification example of the present embodiment is configured to set the phase distribution of the array of the plurality of mirror elements 30 of the spatial light modulator 28 to a phase pattern MP5 of FIG. 12, in order to reduce the variation in peak intensity (intensity of bright lines) of the spatial image of the L&S pattern. In FIG. 12 portions corresponding to those in FIG. 7A are denoted by the same reference signs and detailed description thereof is omitted herein. The phase pattern MP5 of FIG. 12 is one in which a plurality of mirror elements 30A arranged at a pitch not resolved by the projection optical system PL (pitch $5px$ or $6px$ herein) in the X-direction are set in the phase 0 in the first pattern regions 37E (or 37C) in respective partial patterns SP1A to SP5A and in which a plurality of mirror elements 30D arranged at a pitch not resolved by the projection optical system PL (pitch $6px$ or $5px$ herein) in the X-direction are set in the phase π in the second pattern regions 37D (or 37F). In addition, the mirror elements 30 other than the mirror elements 30A in the first pattern regions 37E (or 37C) are set in the phase π and the mirror elements 30 other than the mirror elements 30D in the second pattern regions 37D (or 37F) are set in the phase 0. In this case, the pitch of the mirror elements 30A in the first pattern regions 37E (or 37C) and the pitch of the mirror elements 30D in the second pattern regions 37D (or 37F) may be set so that peak levels of intensity distributions of spatial images of the portions are approximately equal to each other.

Figure 11B:
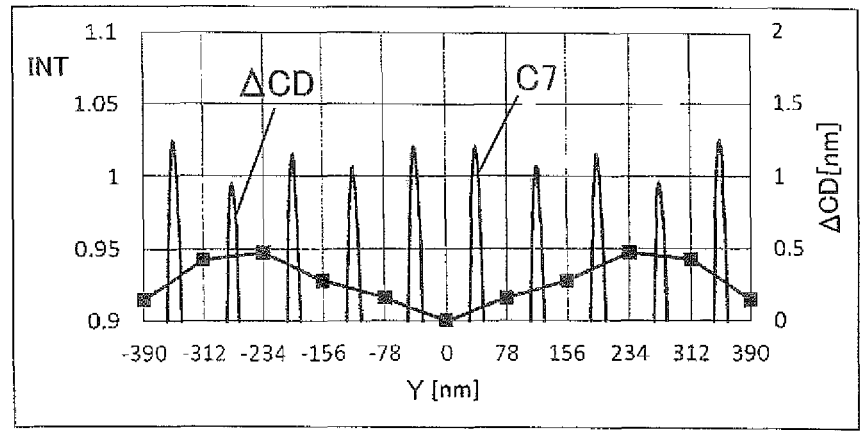

FIG. 11B shows the result of calculation by simulation of the intensity distribution of the spatial image of the L&S pattern formed using the phase pattern MP5 of FIG. 12. In FIG. 11B, the horizontal axis represents Y-coordinates (nm) on the image plane, curves C7 ten peaks (bright lines) of intensity INT (relative values) in the L&S pattern, and a broken line ΔCD errors (nm) of line width from target values when resist patterns are formed with a certain threshold being set for the curves C7. It is seen from the curves C7 that the variation in peak intensity of the spatial image of the L&S pattern is reduced and it is seen from the broken line ΔCD in FIG. 11B that the variation in error of line width is reduced to about 0.5 nm.

As described above, the drive method for the spatial light modulator 28 by the modulation control unit 48 of the exposure apparatus EX in the second modification example is one including: out of the first pattern region 37E and the second pattern region 37D arranged separately in the Y-direction (first direction) and each extending in the X-direction (second direction), setting the plurality of mirror elements 30A arranged at the pitch ($5px$) not resolved by the projection optical system PL, in the X-direction in the first pattern region 37E, in the phase 0 (the first state), setting the other mirror elements 30 in the first pattern region 37E in the phase π, and setting at least a partial set of mirror elements 30 (other than the mirror elements 30D) in the second pattern region 37D in the phase 0.

This modification example allows adjustment of the peak level of the spatial image of the portion corresponding to the first pattern region 37E because the mirror elements 30A in the phase different from that of the other mirror elements 30 are arranged at the pitch not resolved by the projection optical system PL, in the first pattern region 37E. Therefore, the line width or the like of the finally-formed line pattern can be optimized. Furthermore, when the mirror elements 30A are arranged, for example, in an end portion of the first pattern region 37E, the line width or the like of the finally-formed line pattern can be controlled with accuracy finer than the width of the images of the mirror elements 30.

This drive method for the spatial light modulator 28 is also a method for generating a pattern for exposure. Here, the array of the plurality of mirror elements 30 (optical elements) of the spatial light modulator 28 can be regarded as a plurality of sections arranged in a grip pattern and the arrangement of the plurality of mirror elements 30 (sections) of the spatial light modulator 28 set in the first state (phase 0) and in the second state (phase π), as a pattern for exposure.

Figure 3A:
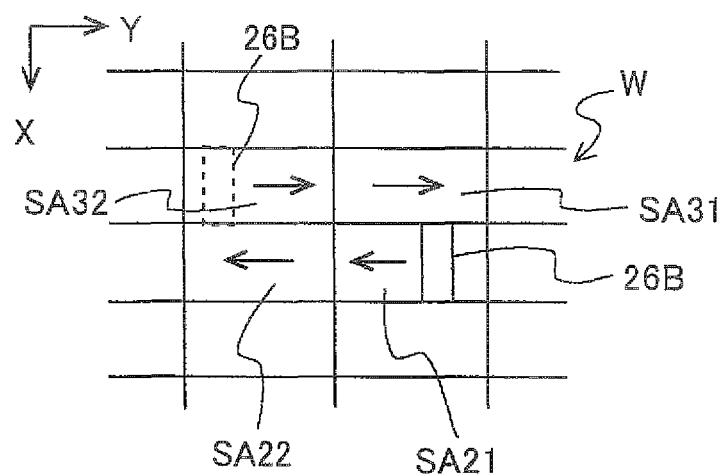
FIG. 3A is a drawing showing shot areas on a wafer in scanning exposure.
Figure 3B:
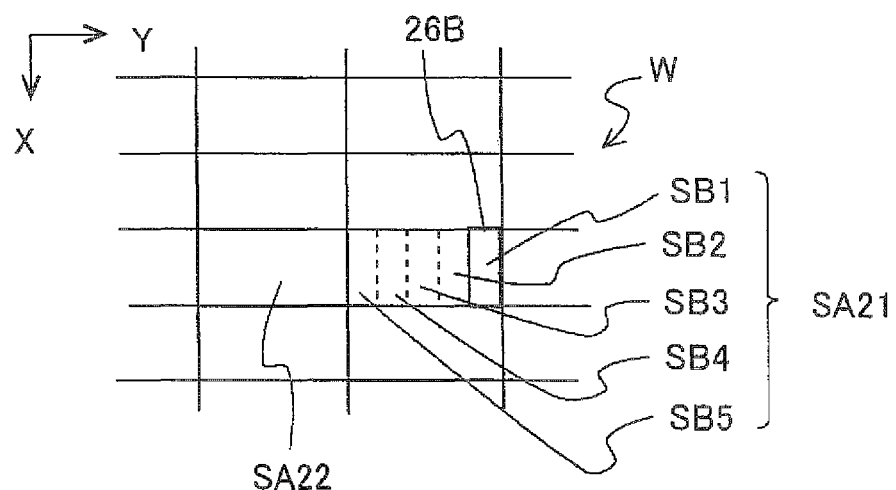
FIG. 3B is a drawing showing shot areas on a wafer in exposure by the step-and-repeat method.

Next, in the above embodiment, the wafer W is continuously moved to implement scanning exposure of the wafer W. In another applicable method, as shown in FIG. 3B, each shot area (e.g., SA21) on the wafer W is divided into a plurality of sub-areas SB1-SB5 or the like in the Y-direction and when the sub-area SB1 or the like reaches the exposure region 26B of the projection optical system PL, a predetermined number of pulses of the illumination light IL are emitted to expose the sub-area SB1 or the like with reflected light from the array of mirror elements 30 of the spatial light modulator 28. After this, the wafer W is stepwise moved in the Y-direction and when the next sub-area SB2 or the like reaches the exposure region 26B, the exposure is carried out in the same manner in the sub-area SB2 or the like. This method is substantially the step-and-repeat method, but the sub-areas SB1-SB5 or the like are exposed with patterns different from each other.

Next, the mirror elements 30 of the spatial light modulator 28 in the above embodiment are subjected to parallel movement to change the phase of the illumination light IL by the first phase or the second phase. However, for example in FIG. 1, it is also possible to use, instead of the spatial light modulator 28, a spatial light modulator having an array of a plurality of mirror elements (reflective elements) an inclination angle of each of which is variable, as disclosed for example in the specification of U.S. Pat. No. 5,312,513 or in the specification of U.S. Pat. No. 6,885,493.

When such a spatial light modulator of the inclination angle varying method is used, the first state of the mirror elements is a state in which the illumination light from the illumination optical system ILS is guided to the projection optical system PL (state of being bright) and the second state of the mirror elements a state in which the illumination light from the illumination optical system ILS is not made incident into the projection optical system PL (state of being dark). In this case as well, the pattern can be formed with position accuracy or shape accuracy finer than the width of the images of the mirror elements in the Y-direction, by setting a state of a plurality of mirror elements arranged at a pitch finer than the resolution limit of the projection optical system PL to the first state or the second state, for example, in a boundary region extending in the X-direction between a first region and a second region, in the array of mirror elements.

Furthermore, it is also possible to use a spatial light modulator configured to change both of the inclination angles of the mirror elements and the phase of the illumination light IL. In this case, the plurality of mirror elements are subjected to parallel movement in the direction of the normal to the plane where the plurality of mirror elements are arranged, and are inclined so as to change the inclination angles to the normal of the reflective faces of the plurality of mirror elements.

Figure 13:
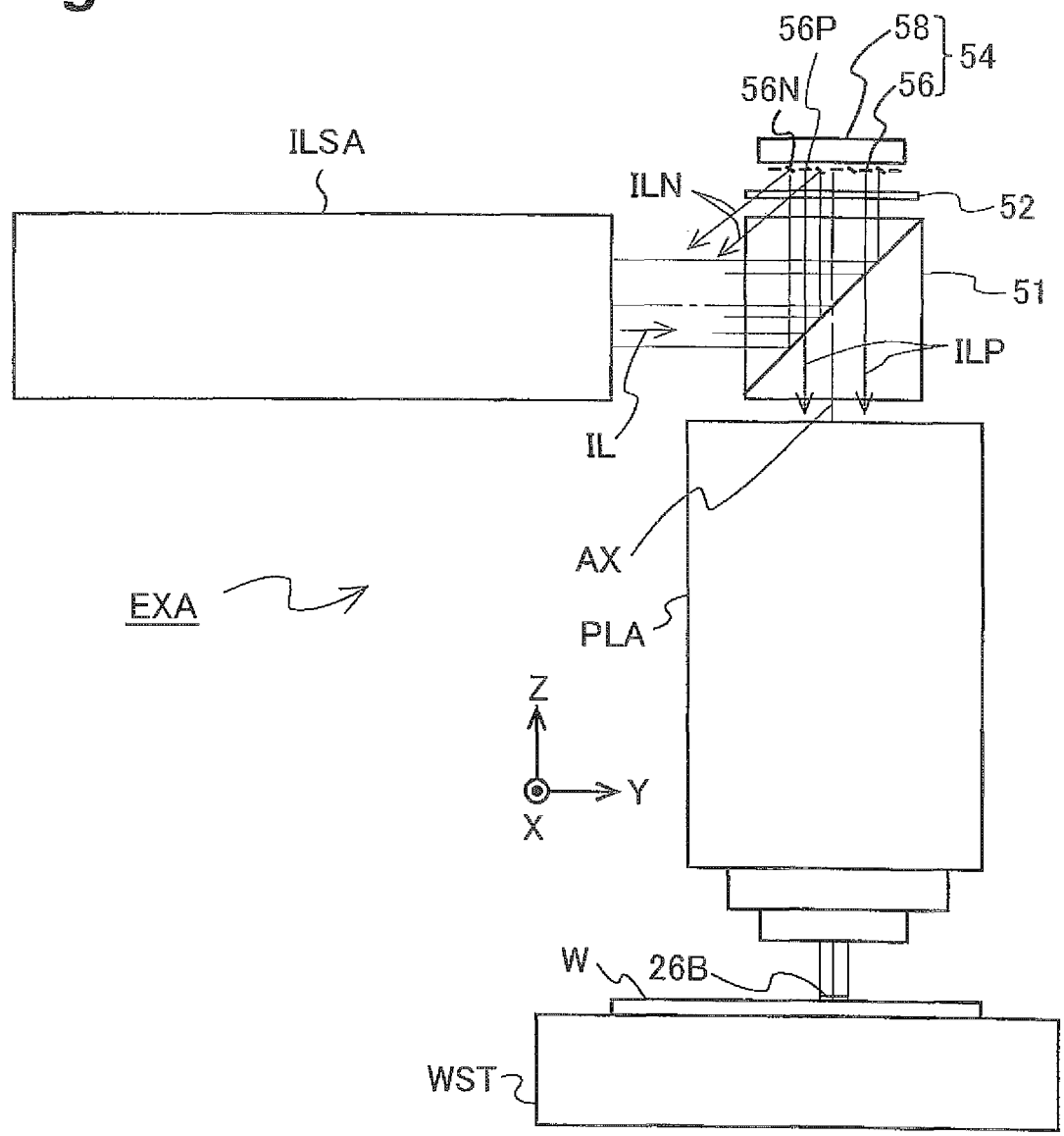
FIG. 13 is a drawing showing a schematic configuration of an exposure apparatus according to a third modification example.

Next, the above embodiment uses the projection optical system PL non-telecentric on the object side. Besides it, it is also possible to use a projection optical system PLA bitelecentric on the object side and on the image plane side, as shown by an exposure apparatus EXA of a third modification example in FIG. 13. In FIG. 13, the exposure apparatus EXA has a light source (not shown), an illumination optical system ILSA which generates S-polarized illumination light IL approximately in the +Y-direction by use of laser light from the light source, a polarization beam splitter 51 which reflects the illumination light IL into the +Z-direction, a quarter wave plate 52 which converts the illumination light IL from the polarization beam splitter 51 into circularly polarized light, a spatial light modulator 54 having a two-dimensional array of a large number of inclination-angle-variable mirror elements 56 which reflect the circularly-polarized illumination light IL into the −Z-direction or into a direction except for it, and a base member 58 supporting the array of these mirror elements, and a projection optical system PLA which receives the illumination light IL having traveled through the quarter wave plate 52 and the polarization beam splitter 51 after having been reflected by the mirror elements 56 and which projects a spatial image (pattern) onto the exposure region 26B on the surface of the wafer W. The illumination optical system ILSA is an optical system obtained by excluding the mirrors 8B, 8C from the illumination optical system ILS in FIG. 1. The pattern can be formed on the wafer W in the maskless method by a combination of mirror elements 56P in the first state (state in which reflected light is made incident into the projection optical system PL) and mirror elements 56N in the second state (state in which reflected light is not made incident into the projection optical system PL), among the mirror elements 56.

In this third modification example, a pattern can also be formed with position accuracy or shape accuracy finer than the width of the images of the mirror elements 56 in the Y-direction, by setting the state of a plurality of mirror elements 56 arranged at a pitch finer than the resolution limit of the projection optical system PL to the first state or the second state, for example, in a boundary region extending in the X-direction between a first region and a second region, in the array of mirror elements 56. Since the exposure apparatus EXA of this third modification example allows the use of the bitelecentric projection optical system PLA, the configuration of the exposure apparatus can be simplified.

Furthermore, in this third modification example, it is also possible to use the phase-variable spatial light modulator 28 in FIG. 1 as the spatial light modulator 54.

When the utilization efficiency of illumination light IL is allowed to reduce to half, an ordinary beam splitter may be used instead of the polarization beam splitter 51, without use of the quarter wave plate 52. In this case, polarized illumination is available.

Furthermore, a rod type integrator as an internal reflection type optical integrator may be used instead of the microlens array 16 as the wavefront division type integrator in FIG. 1.

Figure 14:
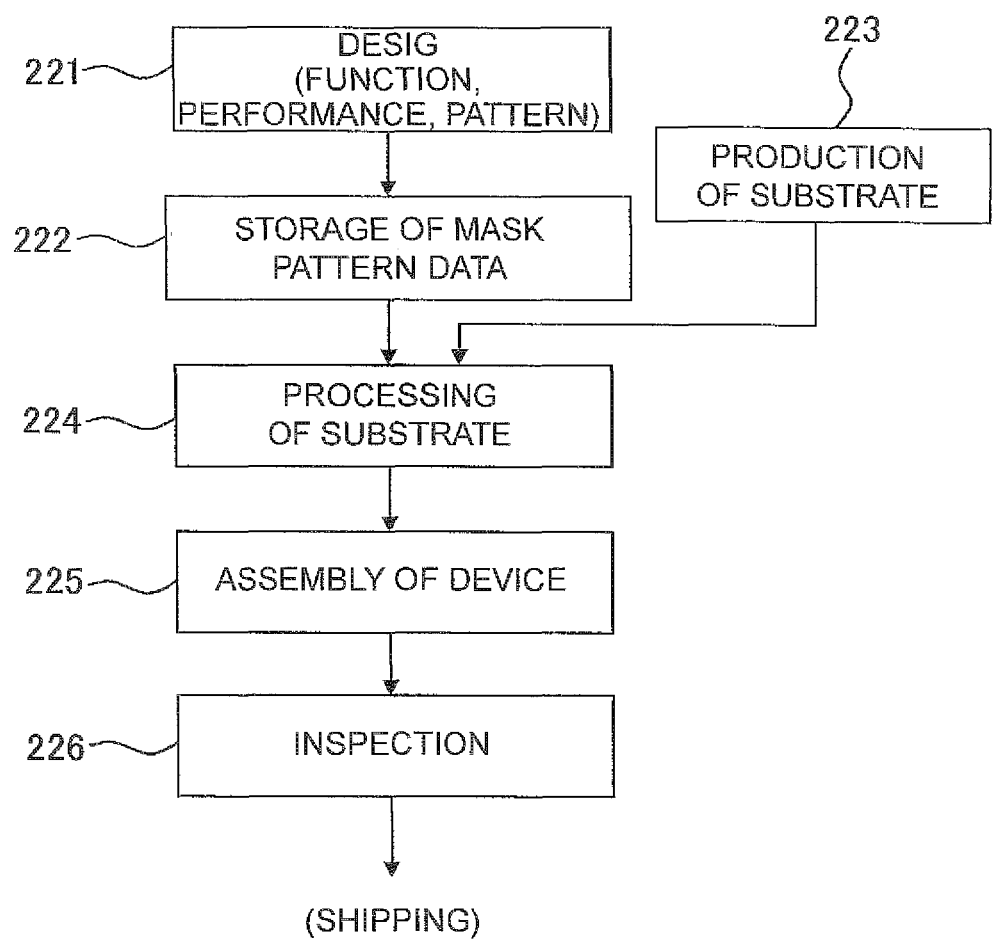
FIG. 14 is a flowchart showing an example of steps for manufacturing electronic devices.

In manufacture of electronic devices (or microdevices), the electronic devices are manufactured, as shown in FIG. 14, through a step 221 to perform design of functionality and performance of the electronic devices, a step 222 to store pattern data of a mask based on this design step, into the main control system of the exposure apparatus EX, EXA in the above embodiment, a step 223 to produce a substrate (wafer) as a base material of the devices and coat the substrate with a resist, a substrate processing step 224 including a step of exposing the substrate (photosensitive substrate) with the spatial image of the phase distribution generated in the spatial light modulator 28 by the aforementioned exposure apparatus EX, EXA (or the exposure method), a step of developing the exposed substrate, and heating (curing) and etching steps of the developed substrate, a device assembly step (including processing steps such as a dicing step, a bonding step, a packaging step, and so on) 225, an inspection step 226, and so on.

This device manufacturing method includes the step of exposing the wafer W with the use of the exposure apparatus (or the exposure method) in the above embodiment, and the step of processing the exposed wafer W (step 224). Therefore, the electronic devices with fine circuit patterns can be manufactured with high accuracy.

Furthermore, the present invention is not limited to the application to semiconductor device manufacturing processes, but the present invention is also widely applicable, for example, to manufacturing processes of liquid crystal display devices, plasma displays, and so on and to manufacturing processes of various devices (electronic devices) such as imaging devices (CMOS type, CCD, etc.), micromachines, MEMS (Microelectromechanical Systems), thin film magnetic heads, and DNA chips.

It should be noted that the present invention can be carried out in a variety of configurations without departing from the spirit and scope of the present invention, while not having to be limited to the above embodiments.

The disclosures in the foregoing Publications, International Publications, U.S. patents, or U.S. Pat. Published applications cited in the present specification are incorporated herein as part of the description of the present specification. The entire disclosure in Japanese Patent Application No. 2012-007727 filed on Jan. 18, 2012 including the specification, the scope of claims, the drawings, and the abstract is incorporated herein by reference in its entirety.

REFERENCE SIGNS LIST

EX, EXA exposure apparatus; ILS, ILSA illumination optical system; PL, PLA projection optical system; W wafer; 28 spatial light modulator; 30 mirror elements; 30A, 30C mirror elements of phase 0; 30B, 30D mirror elements of phase π; 37C first pattern region; 37D second pattern region; 38A first boundary region; 38B second boundary region; 39A third boundary region 39A; 39B fourth boundary region; 48 modulation control unit.

The invention claimed is:
1. An exposure method for exposing an object with exposure light via a plurality of optical elements which are arranged along a first direction and a second direction which is perpendicular to the first direction, the exposure method comprising:

setting optical elements in a first region out of the plurality of optical elements in a first state to emit exposure light having a first phase;

setting optical elements in a second region out of the plurality of optical elements in a second state to emit exposure light having a second phase, the second region being located on the first direction side with respect to the first region, the second state being different from the first state, and the second phase being different from the first phase;

setting a first set of optical elements in a third region out of the plurality of optical elements in the first state to emit exposure light having the first phase, the third region being located between the first region and the second region, wherein the third region is contiguous with the second region;

setting a second set of optical elements in the third region in the second state to emit exposure light having the second phase, wherein each of the optical elements of the second set in the third region is located on a side in the second direction with respect to at least one of the optical elements of the first set of optical elements;

setting a third set of optical elements in a fourth region out of the plurality of optical elements in the first state to emit exposure light having the first phase, the fourth region being located between the first region and the third region, wherein the fourth region is contiguous with the third region; and setting a fourth set of optical elements in the fourth region in the second state to emit exposure light having the second phase, wherein each of the optical elements of the fourth set in the fourth region is located on a side in the second direction with respect to at least one of the optical elements of the third set of optical elements and a boundary line between the first region and the fourth region and a boundary line between the third region and the fourth region are straight lines along the second direction.

2. The exposure method according to claim 1, wherein each of the first region and the second region has a size in the first direction which is smaller than a size thereof in the second direction.

3. The exposure method according to claim 2, wherein the third region has a size in the first direction which is smaller than a size thereof in the second direction.

4. The exposure method according to claim 1, wherein a plurality of the optical elements of the first set is provided along the second direction in the third region between the first region and the second region.

5. The exposure method according to claim 4, wherein the optical elements of the second set are located between the plurality of the optical elements of the first set.

6. The exposure method according to claim 4, wherein said exposing includes illuminating the object with exposure light from the plurality of optical elements via a projection optical system.

7. The exposure method according to claim 6, wherein a pitch of the plurality of the optical elements of the first set or a plurality of the optical elements of the second set is smaller than $\lambda/NA$, where $\lambda$ is a wavelength of the exposure light and NA is an object-side numerical aperture of the projection optical system.

8. The exposure method according to claim 6, wherein a line-and-space pattern is formed with the exposure light, the pattern having a periodicity in a direction corresponding to the second direction.

9. The exposure method according to claim 8, wherein the plurality of optical elements is arranged at a first pitch in the first direction and arranged at a second pitch in the second direction intersecting with the first direction.

10. The exposure method according to claim 9, wherein the line-and-space pattern has a pitch different from a value derived by multiplying the first pitch by a magnification of the projection optical system.

11. The exposure method according to claim 6, wherein at least one of the plurality of optical elements has a size which is not resolved by the projection optical system.

12. A device manufacturing method comprising:
forming a pattern of a photosensitive layer on a substrate, using the exposure method according to claim 1; and
processing the substrate on which the pattern has been formed.

13. An exposure apparatus for exposing an object with exposure light, the exposure apparatus comprising:
a spatial light modulator having a plurality of optical elements provided on an optical path of the exposure light, wherein the optical elements are arranged along a first direction and a second direction which is perpendicular to the first direction; and
a controller configured to drive the plurality of optical elements of the spatial light modulator to set the plurality of optical elements in a first state or a second state, wherein the controller is configured to:
set optical elements in a first region out of the plurality of optical elements in a first state so that exposure light having a first phase is emitted from the optical elements in the first region;
set optical elements in a second region out of the plurality of optical elements in a second state so that exposure light having a second phase is emitted from the optical elements in the second region, the second region being located on the first direction side with respect to the first region, the second state being different from the first state, and the second phase being different from the first phase;
set a first set of optical elements in a third region in the first state, the third region being located between the first region and the second region and contiguous with the second region;
set a second set of optical elements in the third region in the second state, wherein each of the optical elements of the second set is located on a side in the second direction with respect to one or more of the optical elements of the first set;
set a third set of optical elements in a fourth region out of the plurality of optical elements in the first state to emit exposure light having the first phase, the fourth region being located between the first region and the third region and contiguous with the third region; and
set a fourth set of optical elements in the fourth region in the second state to emit exposure light having the second phase, wherein each of the optical elements of the fourth set is located on a side in the second direction with respect to one or more of the optical elements of the third set and a boundary line between the first region and the fourth region and a boundary line between the third region and the fourth region are straight lines along the second direction.

14. The exposure apparatus according to claim 13, wherein each of the first region and the second region has a size in the first direction which is smaller than a size thereof in the second direction.

15. The exposure apparatus according to claim 14, wherein the third region has a size in the first direction which is smaller than a size thereof in the second direction.

16. The exposure apparatus according to claim 15, further comprising a projection optical system configured to illuminate the object with exposure light from the plurality of optical elements.

17. The exposure apparatus according to claim 16, wherein a plurality of the optical elements of the first set are provided along the second direction in the third region between the first region and the second region.

18. The exposure apparatus according to claim 17, wherein a pitch of the plurality of the optical elements of the first set or a plurality of the optical elements of the second set is smaller than λ/NA, where λ is a wavelength of the exposure light and NA is an object-side numerical aperture of the projection optical system.

19. The exposure apparatus according to claim 16, wherein the exposure apparatus is configured to form a line-and-space pattern with the exposure light, the pattern having a periodicity in a direction corresponding to the second direction.

20. The exposure apparatus according to claim 19, wherein the plurality of optical elements of the spatial light modulator is arranged at a first pitch in the first direction and arranged at a second pitch in the second direction intersecting with the first direction.

21. The exposure apparatus according to claim 20, wherein the line-and-space pattern has a pitch different from a value derived by multiplying the first pitch by a magnification of the projection optical system.

22. The exposure apparatus according to claim 16, wherein at least one of the plurality of optical elements has a size which is not resolved by the projection optical system.

23. A device manufacturing method comprising:
    forming a pattern of a photosensitive layer on a substrate, using the exposure apparatus according to claim 13; and
    processing the substrate on which the pattern has been formed.

* * * * *